(12) United States Patent
Kodama

(10) Patent No.: US 8,845,077 B2
(45) Date of Patent: Sep. 30, 2014

(54) PATTERN FORMING METHOD AND PATTERN FORMING APPARATUS

(71) Applicant: FUJIFILM Corporation, Tokyo (JP)

(72) Inventor: Jun Kodama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/828,868

(22) Filed: Mar. 14, 2013

(65) Prior Publication Data
US 2013/0201240 A1    Aug. 8, 2013

Related U.S. Application Data

(63) Continuation of application No. PCT/JP2011/071086, filed on Sep. 15, 2011.

(30) Foreign Application Priority Data

Sep. 16, 2010   (JP) .................................. 2010-208323
Mar. 29, 2011   (JP) .................................. 2011-072576

(51) Int. Cl.
| | | |
|---|---|---|
| *B41J 2/15* | (2006.01) | |
| *B41J 2/045* | (2006.01) | |
| *H05K 3/12* | (2006.01) | |
| *B41J 11/00* | (2006.01) | |
| *B41J 3/407* | (2006.01) | |
| *B41J 2/01* | (2006.01) | |

(52) U.S. Cl.
CPC ............ *B41J 2/04505* (2013.01); *H05K 3/1283* (2013.01); *B41J 11/0015* (2013.01); *B41J 3/407* (2013.01); *H05K 2203/107* (2013.01); *H05K 3/125* (2013.01); *B41J 2002/012* (2013.01); *B41J 2/01* (2013.01)
USPC ................. 347/40; 438/21; 438/28; 438/274; 29/846; 219/121.85; 219/121.6

(58) Field of Classification Search
USPC ................ 347/14, 40; 427/256, 258; 438/674
See application file for complete search history.

(56) References Cited

U.S. PATENT DOCUMENTS 6,877,853 B2 *   4/2005   Kiguchi et al. ............... 347/102
7,135,389 B2 *  11/2006   Yamazaki et al. ............ 438/487
(Continued)

FOREIGN PATENT DOCUMENTS

| JP | 2004-276591 A | 10/2004 |
|---|---|---|
| JP | 2005-081159 A | 3/2005 |

(Continued)

OTHER PUBLICATIONS

An Office Action: "Notice of Final Rejection," issued by the Korean Intellectual Property Office on Sep. 5, 2013, which corresponds to Korean Patent Application No. 10-2013-7007102 and is related to U.S. Appl. No. 13/828,868; with translation.

(Continued)

*Primary Examiner* — Matthew Luu
*Assistant Examiner* — Lily Kemathe
(74) *Attorney, Agent, or Firm* — Studebaker & Brackett PC

(57) ABSTRACT

A pattern forming method includes: a modification treatment step of, in accordance with a pattern to be formed on a pattern forming surface of a base body, applying a light beam having a width smaller than a diameter of each of dots to constitute the pattern, onto a treatment target region including at least outer edges on both sides in a width direction of a region where the pattern is to be formed in the pattern forming surface, thereby carrying out modification treatment on the treatment target region; and a droplet deposition step of ejecting and depositing droplets of a functional liquid by an inkjet method onto the region where the pattern is to be formed including the treatment target region where the modification treatment has been carried out.

14 Claims, 26 Drawing Sheets

(56) References Cited

U.S. PATENT DOCUMENTS

| | | | |
|---|---|---|---|
| 7,553,375 B2* | 6/2009 | Sekiya | 118/62 |
| 7,560,397 B2* | 7/2009 | Yamazaki et al. | 438/795 |
| 7,585,783 B2* | 9/2009 | Nakamura et al. | 438/758 |
| 7,678,697 B2* | 3/2010 | Hirai | 438/674 |
| 7,738,261 B2* | 6/2010 | Sekiya | 361/812 |
| 7,867,561 B2* | 1/2011 | Mori et al. | 427/256 |
| 7,887,877 B2* | 2/2011 | Morimoto et al. | 427/66 |
| 8,002,008 B2* | 8/2011 | Sekiya | 156/390 |
| 8,197,882 B2* | 6/2012 | Hasei et al. | 427/58 |
| 8,324,657 B2* | 12/2012 | Shimizu et al. | 257/139 |
| 8,517,530 B2* | 8/2013 | Sekiya | 347/102 |
| 8,528,497 B2* | 9/2013 | Nakamura et al. | 118/642 |
| 8,536,056 B2* | 9/2013 | Su et al. | 438/670 |
| 2007/0019032 A1 | 1/2007 | Maekawa et al. | |

FOREIGN PATENT DOCUMENTS

| | | |
|---|---|---|
| JP | 2005-159327 A | 6/2005 |
| JP | 2005-246241 A | 9/2005 |
| JP | 2005-246242 A | 9/2005 |
| JP | 2006-047276 A | 2/2006 |
| JP | 2006-212477 A | 8/2006 |
| JP | 2008-004834 A | 1/2008 |
| JP | 2010-012391 A | 1/2010 |

OTHER PUBLICATIONS

International Search Report; PCT/JP2011/071086; Dec. 27, 2011.
Written Opinion of the International Searching Authority; PCT/JP2011/071086; Dec. 27, 2011.
B.Jeong; Korean Office Action, Notice of Grounds for Rejection; KR2013-7007102; May 10, 2013.

* cited by examiner

50μm

PATTERN FORMING METHOD AND PATTERN FORMING APPARATUS

TECHNICAL FIELD

The present invention relates to a pattern forming method and a pattern forming apparatus, and more particularly to fine pattern forming technology using an inkjet method.

BACKGROUND ART

In recent years, attention has focused on technology for forming fine patterns such as an electrical wire pattern and mask pattern on the substrate, by using a liquid ejection head (inkjet head) based on an inkjet method. For example, by ejecting droplets of liquid in which metal particles or resin particles are dispersed, from an inkjet head so as to place the droplets on a substrate, a pattern image is formed on a substrate by the liquid, and this pattern is cured by heating or the like, thereby forming an electric wire pattern or a mask pattern. An issue involved in the pattern image forming using the inkjet method is blurring of the ink due to the occurrence of bulging (clumping) which arises when a plurality of droplets deposited on a substrate combine together, and due to the occurrence of jagged edges caused by deviation in the direction of flight of the droplets or movement of the droplets which have been deposited on the substrate.

FIGS. 31A and 31B are diagrams illustrating problems of a fine pattern forming method which uses the inkjet method in the related art, and depict a pattern forming surface 1A of a substrate 1. FIG. 31A shows a state where a plurality of droplets 2 that have been deposited on the pattern forming surface 1A of the substrate 1 have combined together to form one large droplet 3 (a state in which a bulge has occurred). On the other hand, FIG. 31B shows a state where deviation of the landing positions occurs in the droplets 2 deposited on the pattern forming surface 1A of the substrate 1, and hence jaggedness has occurred. In each of FIGS. 31A and 31B, the pattern that originally ought to be formed is indicated by dashed lines denoted with reference numeral 4. Various investigations have been carried out in order to resolve these problems.

NPTL 1 discloses technology for forming an accurate fine pattern image by placing droplets on the substrate by using an inkjet method, after partially changing the surface energy of the substrate through the use of photolithographic technology.

PTL 1 discloses a liquid ejection apparatus which is composed in such a manner that droplets are ejected toward a region surrounded by laser light, whereby droplets which leave a prescribed path of travel are returned to the prescribed path of travel and hence droplets are deposited within the region surrounded by the laser light.

PTL 2 discloses a method in which a solution containing a functional material is sprayed by an inkjet method, thereby leaving the functional material on a base body and hence manufacturing a functional base body. In the technology disclosed in PTL 2, a composition is adopted in which a base body is irradiated with laser light before spraying the solution of the functional material, in such a manner that the adhesiveness of the solution on the base body is improved. PTL 2 further discloses that the size of a single dot (which has a diameter of 15 μm) is larger than the spot size of laser light (which has a diameter of 10 μm).

CITATION LIST

Patent Literature

PTL 1: Japanese Patent Application Publication No. 2004-276591
PTL 2: Japanese Patent Application Publication No. 2005-081159

Non-Patent Literature

NPTL 1: Koei Suzuki, "All Printed Organic TFT Array for Flexible Electrophoresis Display", (Japan), Displays, Techno Times, May 2010, Vol. 16, No. 5, pp. 35 to 40

SUMMARY OF INVENTION

Technical Problem

However, the technology disclosed in NPTL 1 requires previous photomasking, and hence an alignment step between the photomask and the substrate is essential. Moreover, since the photomask cannot be made to correspond to deformation (distortion) of the substrate, then the processing for changing the surface energy of the substrate cannot be made to follow the deformation, or the like, of the substrate. Therefore, a problem arises in that the formed pattern image deviates due to the deformation of the substrate, and the like.

The liquid ejection apparatus disclosed in PTL 1 is able to avoid deflection of the direction of flight of the droplets, but cannot avoid movement of the droplets after landing. Consequently, it is difficult to avoid blurring of the pattern due to the occurrence of bulges resulting from combination of droplets on the substrate and the occurrence of jaggedness due to movement of the droplets after landing.

In the method of manufacturing the functional base body disclosed in PTL 2, the spot size of the laser light is smaller than the size of the individual dot, and therefore jaggedness occurs in the edge portions of the pattern of the functional material and the quality of the pattern of the functional material declines. Moreover, the wetting and spreading of the solution of the functional material is restricted by the irradiation region of the laser light, and it is difficult to obtain dots of a prescribed size.

The present invention has been contrived in view of these circumstances, an object thereof being to provide a pattern forming method and a pattern forming apparatus whereby blurring of a pattern in the formation of a fine pattern using an inkjet method is prevented and formation of a fine pattern which follows (responds to) distortion of the substrate can be achieved.

Solution to Problem

In order to attain the aforementioned object, a pattern forming method according to one aspect of the present invention comprises: a modification treatment step of, in accordance with a pattern to be formed on a pattern forming surface of a base body, applying a light beam having a width smaller than a diameter of each of dots to constitute the pattern, onto a treatment target region including at least outer edges on both sides in a width direction of a region where the pattern is to be formed in the pattern forming surface, thereby carrying out modification treatment on the treatment target region; and a droplet deposition step of ejecting and depositing droplets of a functional liquid by an inkjet method onto the region where the pattern is to be formed including the treatment target region where the modification treatment has been carried out.

According to this aspect, in accordance with the pattern to be formed on the pattern forming surface of the base body, by carrying out the modification treatment by applying the light beam having the width smaller than the diameter of each of dots to constitute the pattern, onto the treatment target region including at least the outer edges on both sides in the width direction of the region where the pattern is to be formed in the pattern forming surface, then even if deviation occurs in the landing positions of the dots, the dots are drawn to prescribed positions, thus preventing deviation in the dot positions and combination of the dots due to such deviation of the dot positions.

Furthermore, by carrying out the modification treatment at a resolution exceeding the dot resolution (the image formation resolution), the fixing positions of the dots are adjusted at the order of the resolution of the modification treatment, and therefore the quality of the pattern (the image formation quality) is improved.

In particular, jaggedness occurring in the edge portions of the pattern (the respective end portions of the pattern in the width direction) is adjusted at the resolution of the modification treatment, and therefore such jaggedness is not readily visible and the quality of the edge portions of the pattern is improved.

Furthermore, the treatment target region of the modification treatment corresponding to the pattern is desirably the whole region that is to be covered with the liquid constituting the pattern, including the interior of the pattern and the outer edges of both sides of the pattern in the width direction.

The light beam used for the modification treatment can employ a laser light beam (laser light spot). For example, if a substrate surface is irradiated with laser light in the air, then the irradiation region is modified to have stronger affinity to the liquid than the non-irradiation region.

Preferably, the base body is a substrate.

According to this aspect, a desirable fine pattern is formed directly on the substrate by the inkjet method.

In this aspect, it is a preferable aspect to further comprise a relative conveyance step of conveying the inkjet head and the substrate relatively to each other.

Preferably, the method further comprises a temperature adjustment step of adjusting a temperature of the substrate at least one of: during the modification treatment step, during the droplet deposition step, and after the droplet deposition step.

According to this aspect, it is possible to promote the modification treatment by adjusting the temperature of the substrate during the modification treatment step.

Furthermore, by adjusting the temperature of the substrate during the droplet placement step or after the droplet placement step, then it is possible to suitably adjust the shape (thickness, dot diameter) of the droplets of the functional liquid.

Preferably, the method further comprises, after the droplet deposition step, an auxiliary light application step of applying auxiliary light onto the deposited droplets.

According to this aspect, it is possible to promote the curing of the droplets (dots) of the functional liquid deposited in the droplet deposition step, and also to control the shape of the dots.

In this aspect, a liquid of which curing can be promoted by irradiation with the auxiliary light is employed as the functional liquid.

An example of the auxiliary light in this aspect is ultraviolet light beam. By adjusting the applied amount of the ultraviolet light beam, it is possible to control (adjust) the cured state of the droplets (dots) of the functional liquid.

It is also preferable that the base body is an intermediate transfer body; and the method further comprises a transfer step of transferring the pattern formed on the intermediate transfer body, onto a substrate.

According to this aspect, it is possible to form a desirable fine pattern on the substrate in the intermediate transfer method.

Preferably, the method further comprises a temperature adjustment step of adjusting a temperature of the substrate at least one of: during the transfer step, and after the transfer step.

According to this aspect, curing of the pattern transferred to the substrate is promoted.

It is also a preferable aspect to adjust the temperature of the intermediate transfer body during the droplet deposition step.

Preferably, the method further comprises, after the transfer step, an auxiliary light application step of applying auxiliary light onto the transferred pattern.

According to this aspect, curing of the pattern transferred to the substrate is promoted.

Preferably, the method further comprises a determination step of determining distortion of the substrate; and a correction data generation step of generating correction data for application data of the light beam and deposition data of the droplets, in accordance with the determined distortion of the substrate, wherein: in the modification treatment step, the light beam is applied onto the treatment target region in accordance with the correction data, and in the droplet deposition step, the droplets are ejected and deposited by the inkjet method onto the treatment target region where the modification treatment has been carried out, in accordance with the correction data.

According to this aspect, the correction data for the modification treatment data and the correction data for the droplet deposition data are generated on demand, by using the common determination results obtained as the distortion information of the substrate determined in the determination step, and therefore desirable modification treatment and pattern formation corresponding to the distortion of each substrate are achieved.

Preferably, the determination step includes a reading step of reading a read section arranged on the pattern forming surface of the substrate; and a distortion information acquisition step of acquiring distortion information in accordance with the read results (read signal).

Preferably, the modification treatment step includes a reactive gas supply step of supplying reactive gas to the region to which the light beam is applied.

According to this aspect, the efficiency of the modification treatment is improved by carrying out the modification treatment in the reactive gas atmosphere. Furthermore, by selectively switching the types of the reactive gases, the contents of the modification treatment can be switched selectively.

For example, if oxygen gas or nitrogen gas is used as the reactive gas, then the modification treatment is a liquid-affinity enhancement treatment, whereas if a fluoric gas is used as the reactive gas, then the modification treatment is a liquid-repellency enhancement treatment.

Preferably, in the modification treatment step, an interior of the pattern is set as a modification treatment region to which the light beam is applied.

According to this aspect, the droplets (dots) of the functional liquid are drawn to the interior of the pattern where the modification treatment has been carried out, and the dots are prevented from projecting to the outside of the pattern and becoming fixed there.

In this aspect, when the pattern is to be formed by a liquid having an aqueous solvent, a hydrophilization treatment is carried out in the modification treatment step, and when the pattern is to be formed by a liquid having an organic solvent, a hydrophobization treatment is carried out in the modification treatment step.

Preferably, in the modification treatment step, the light beam having an application width of not larger than ½ of a full width of the pattern is applied onto the outer edges on both sides of the pattern in the width direction.

According to this aspect, by carrying out the modification treatment on the outer edges of the pattern, the portions which have undergone the modification treatment form barriers which keep the droplets (dots) of the functional liquid inside the pattern, and therefore the dots forming the pattern are prevented from projecting outside the pattern and becoming fixed there.

In this aspect, when the pattern is to be formed by a liquid having an aqueous solvent, a hydrophobization treatment is carried out in the modification treatment step, and when the pattern is to be formed by a liquid having an organic solvent, a hydrophilization treatment is carried out in the modification treatment step.

Preferably, in the modification treatment step, the modification treatment is carried out on the treatment target region including outer sides of the outer edges of both sides of the pattern in the width direction.

In this aspect, it is a preferable aspect that the modification treatment is the liquid-repellency enhancement treatment.

Preferably, in the modification treatment step, the light beam having the width of not larger than ⅒ of the diameter of each of the dots is applied.

In this aspect, it is a preferable aspect that the application diameter of one beam is not larger than ⅒ of the dot diameter.

Preferably, in the modification treatment step, the light beam is applied at a resolution exceeding a resolution of the deposition of the dots.

In this aspect, the "dot resolution" is expressed as a number of dots per unit surface area (or length) on the pattern forming surface. Furthermore, the "light beam resolution" can be a number of applications (spots) per unit surface area of the pattern forming surface, and in a mode in which the pattern forming surface is scanned in a prescribed direction with a light beam, can be a number of scans per unit length of the pattern forming surface.

Preferably, in the modification treatment step, the light beam is applied at a resolution of not less than 10 times a resolution of the deposition of the dots.

In this aspect, it is a preferable aspect that the application pitch of the light beam is smaller than the diameter of the light beam (the application diameter).

Furthermore, in order to attain the aforementioned object, a pattern forming apparatus according to one aspect of the present invention comprises: a modification treatment device which is configured to, in accordance with a pattern to be formed on a pattern forming surface of a base body, apply a light beam having a width smaller than a diameter of each of dots to constitute the pattern, onto a treatment target region including at least outer edges on both sides in a width direction of a region where the pattern is to be formed in the pattern forming surface, to thereby carry out modification treatment on the treatment target region; and an inkjet head which is configured to carry out droplet deposition by ejecting and depositing droplets of a functional liquid by an inkjet method onto the region where the pattern is to be formed including the treatment target region where the modification treatment has been carried out.

Preferably, the base body is a substrate.

In this aspect, it is a preferable aspect that the pattern forming apparatus further comprises a relative conveyance device which is configured to convey the inkjet head and the substrate relatively to each other.

Preferably, the pattern forming apparatus further comprises a temperature adjustment device which is configured to adjust a temperature of the substrate at least one of: during the modification treatment, during the droplet deposition, and after the droplet deposition.

Preferably, the pattern forming apparatus further comprises an auxiliary light application device which is configured to apply auxiliary light onto the deposited droplets.

It is also preferable that the base body is an intermediate transfer body; and the apparatus further comprises a transfer device which is configured to transfer the pattern formed on the intermediate transfer body, onto a substrate.

Preferably, the pattern forming apparatus further comprises a temperature adjustment device which is configured to adjust a temperature of the substrate at least one of: during the transfer, and after the transfer.

Preferably, the pattern forming apparatus further comprises an auxiliary light application device which is configured to apply auxiliary light onto the transferred pattern.

Preferably, the pattern forming apparatus further comprises a determination device which is configured to determine distortion of the substrate; and a correction data generation device which is configured to generate correction data for application data of the light beam and deposition data of the droplets, in accordance with the determined distortion of the substrate, wherein: the modification treatment device is configured to apply the light beam onto the treatment target region in accordance with the correction data, and the inkjet head is configured to eject and deposit the droplets onto the treatment target region where the modification treatment has been carried out, in accordance with the correction data.

Preferably, the modification treatment device includes a reactive gas supply device which is configured to supply reactive gas to the region to which the light beam is applied.

Preferably, the modification treatment device is configured to set an interior of the pattern as a modification treatment region to which the light beam is applied.

Preferably, the modification treatment device is configured to apply the light beam having an application width of not larger than ½ of a full width of the pattern, onto the outer edges on both sides of the pattern in the width direction.

Preferably, the modification treatment device is configured to carry out the modification treatment on the treatment target region including outer sides of the outer edges of both sides of the pattern in the width direction.

Preferably, the modification treatment device is configured to apply the light beam having the width of not larger than ⅒ of the diameter of each of the dots.

Preferably, the modification treatment device is configured to apply the light beam at a resolution exceeding a resolution of the deposition of the dots.

Preferably, the modification treatment device is configured to apply the light beam at a resolution of not less than 10 times a resolution of the deposition of the dots.

Advantageous Effects of Invention

According to the present invention, by carrying out modification treatment on a treatment target region corresponding to a pattern to be formed on a pattern forming surface of a base body, then even if there is deviation in landing positions of dots, the dots are drawn to prescribed positions and therefore deviation in the dot positions is prevented and combination of the dots due to the deviation in the dot positions is also prevented. Furthermore, by carrying out the modification treatment with a light beam having a width smaller than the diameter of each dot, the fixing positions of the dots are adjusted at the order of the width of the light beam, and therefore the quality of the pattern (image formation quality) is improved. In particular, jaggedness occurring in the edge portions of the pattern (the respective end portions of the pattern in the width direction) is adjusted to the width of the modification treatment, and therefore such jaggedness is not readily visible and the quality of the edge portions of the pattern is improved. Moreover, by determining distortion of the substrate and accordingly changing the modification pattern, it is possible to correct deviation of the pattern, on demand, and the quality of image formation can be improved.

DESCRIPTION OF EMBODIMENTS

Below, preferred embodiments of the present invention are described in detail with reference to the accompanying drawings.

<Description of Pattern Forming Method>

The pattern forming method according to an embodiment of the present invention forms a fine pattern, such as an electrical wire pattern, mask pattern (resist pattern) or the like, on a pattern forming surface of a substrate (base body), such as a glass substrate, a silicon substrate (silicon wafer), a silicone resin substrate, a film substrate, an insulated metal plate, or the like. The pattern forming method according to the present embodiment includes: a modification treatment step of carrying out modification treatment on a modification treatment region which corresponds to a region where a wiring pattern is to be formed; and a droplet deposition step (pattern forming step) of placing droplets of a functional liquid (hereinafter also referred simply to as the "liquid"), such as a dispersion of metal particles obtained by dispersing metal particles in a solvent, or a dispersion of resin particles obtained by dispersing resin particles in a solvent, on the substrate after the modification treatment.

Figure 1:
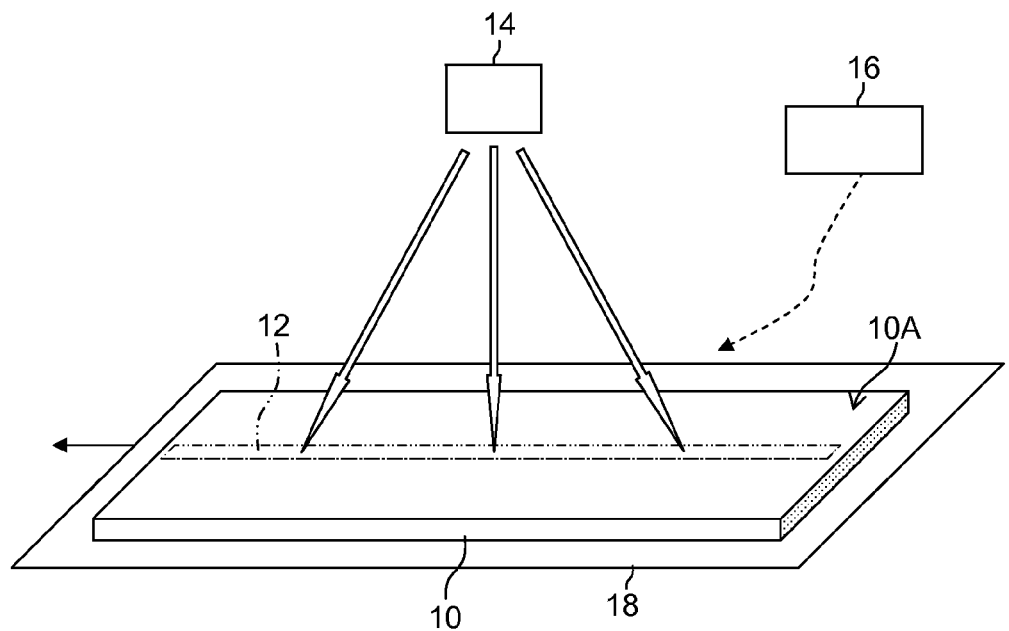
FIG. 1 is a schematic drawing of a modification treatment step in a pattern forming method relating to a first embodiment of the present invention.

FIG. 1 is a conceptual drawing of a modification treatment step in the pattern forming method according to the present embodiment. The modification treatment step shown in FIG. 1 is a step of carrying out modification treatment by applying modification treatment energy (indicated by blank arrows) from a modification energy application unit 14, to a region where a straight line-shaped fine pattern 12 (indicated by double-dotted lines) is to be formed on a pattern forming surface 10A of a substrate 10.

The substrate 10 can employ a glass substrate, silicon substrate (silicon wafer), film substrate, silicone resin substrate, insulated metal plate, or the like. Examples of the material of the glass substrate include quartz and lead-free glass for LCD use. Moreover, it is also possible to employ a glass epoxy resin substrate which combines glass and epoxy resin, for example.

Furthermore, examples of the material used as the film substrate include: polyethylene naphthalene (PEN), polyethylene terephthalate (PET), polycarbonate (PC), polyether sulfone (PES), and the like.

The film substrate can include a barrier layer or a conductive layer. The material of the insulated metal plate can be: an alumina substrate obtained by oxidizing a surface of aluminum, or the like.

The modification energy used in the modification treatment step in the present embodiment employs laser light (a light spot). An example of the laser light is light in the ultraviolet region or visible region, having a wavelength of 300 nm, 365 nm, 405 mm, and the like, the output is 10 to several hundred mJ/cm$^2$ and the diameter of the laser light beam (spot diameter) is 1 to 2 μm.

Of course, it is also possible to employ laser light in the infrared region, as well as the ultraviolet region and the visible light region. Furthermore, it is possible to use various lasing media, such as a semiconductor laser, a solid laser, a liquid laser, a gas laser, or the like.

The modification energy application unit 14 which employs the laser light beam for the modification energy is equipped with a laser light source unit (oscillator), which generates the laser light, and a light application head, which applies the laser light that has been narrowed to a prescribed beam diameter by an optical system, onto the substrate. The laser light source can be incorporated in the light application head or can be arranged outside the light application head.

Examples of modification treatment include a liquid-affinity enhancement treatment and a liquid-repellency enhancement treatment. By switching the reactive gases used for the modification treatments, it is possible to selectively switch between the liquid-affinity enhancement treatment and the liquid-repellency enhancement treatment.

For example, when the substrate 10 that is the object of the modification treatment is placed in an atmosphere to which a reactive gas containing oxygen or a reactive gas containing nitrogen has been supplied from a reactive gas (atmospheric gas) supply unit 16, and the substrate 10 in the reactive gas atmosphere is irradiated with the laser light, then the irradiation region, which is irradiated with the laser light, is modified so as to have stronger affinity to the liquid than the non-irradiation region, which is not irradiated with the laser light.

On the other hand, when the substrate 10 that is arranged in a fluoric gas atmosphere is irradiated with the laser light, then the irradiation region, which is irradiated with the laser light, is modified so as to have stronger repellency to the liquid than the non-irradiation region, which is not irradiated with the laser light.

Here, a "state having strong affinity to the liquid" means a state where a contact angle of a droplet of the liquid with respect to the substrate 10 is relatively small, and a "state having strong repellency to the liquid" means a state where a contact angle of a droplet of the liquid with respect to the substrate 10 is relatively large.

A concrete example of the "state having strong affinity to the liquid" is a state where the contact angle of a droplet of the liquid with respect to the substrate 10 is not larger than 45°. A concrete example of the "state having strong repellency to the liquid" is a state where the contact angle of a droplet of the liquid with respect to the substrate 10 is not smaller than 80°.

FIG. 1 shows a state where the laser light beam is applied while the substrate 10 held on a stage 18 is moved in a prescribed movement direction (in the drawing, the movement direction is represented with an arrow). In the direction perpendicular to the movement direction of the substrate 10, the substrate 10 can be scanned in the same direction with the laser light beam, or it is also possible to employ multiple irradiation in which a plurality of light spot emission apertures are arranged so as to correspond to the dimension (full width) of the substrate 10 in the same direction and the laser light is applied simultaneously through the apertures. In the mode which scans the substrate 10 with one laser light beam, the width of one scanning action corresponds to the diameter of the light spot.

Furthermore, it is also possible to adopt a mode in which a light application head (modification energy application unit 14) is moved with respect to a fixed substrate 10. More specifically, the mode is also possible in which the laser light is applied onto a prescribed irradiation region, while the light application head is moved by a movement mechanism which supports the light application head and moves the light application head two-dimensionally.

Figure 2:
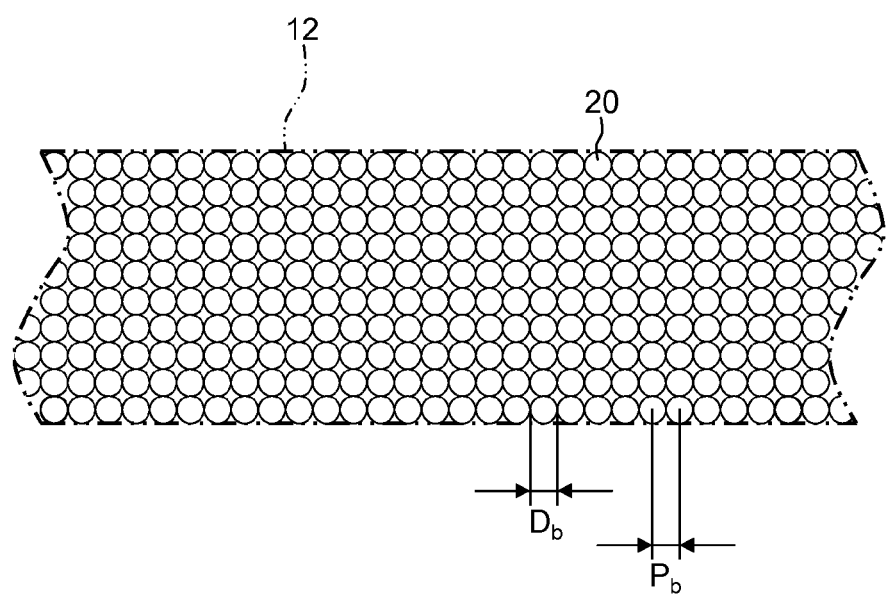
FIG. 2 is an illustrative diagram showing a schematic view of a state after modification treatment in the modification treatment shown in FIG. 1.

FIG. 2 is an illustrative diagram showing a schematic view of a state where the modification treatment has been carried out on the region where the fine pattern 12 is to be formed (the inside of the inner edges of the region where dots constituting the fine pattern are placed; the region which is covered with the liquid (dots) as described below).

In FIG. 2, the shape of the fine pattern 12 is indicated by the double-dotted lines. In the modification treatment step, the diameter (irradiation diameter) Db of the laser light beam which is applied onto the substrate 10 (see FIG. 1) is 2 μm, and the irradiation pitch Pb of the laser light beam is smaller than 2 μm.

In FIG. 2, for the purposes of the illustration, the irradiation regions of the beams of the laser light which are denoted with the reference numeral 20 are shown as not mutually overlapping; however, in actual practice, the modification treatment is carried out over the whole internal area of the pattern 12.

More specifically, the modification treatment target region, which is the region where the fine pattern 12 is to be formed, is irradiated with the laser light in such a manner that the laser light beams having the irradiation diameter (irradiation width) of 2 μm per beam completely cover the region where the fine pattern 12 is to be formed, without any gaps.

The irradiation diameter (irradiation width) Db of the laser light beam is sufficiently smaller than the diameter Dd of the dots described below (see FIG. 4), and the irradiation pitch Pb of the laser light beam is sufficiently smaller than the dot pitch Pd of the pattern (see FIG. 4).

Figure 3:
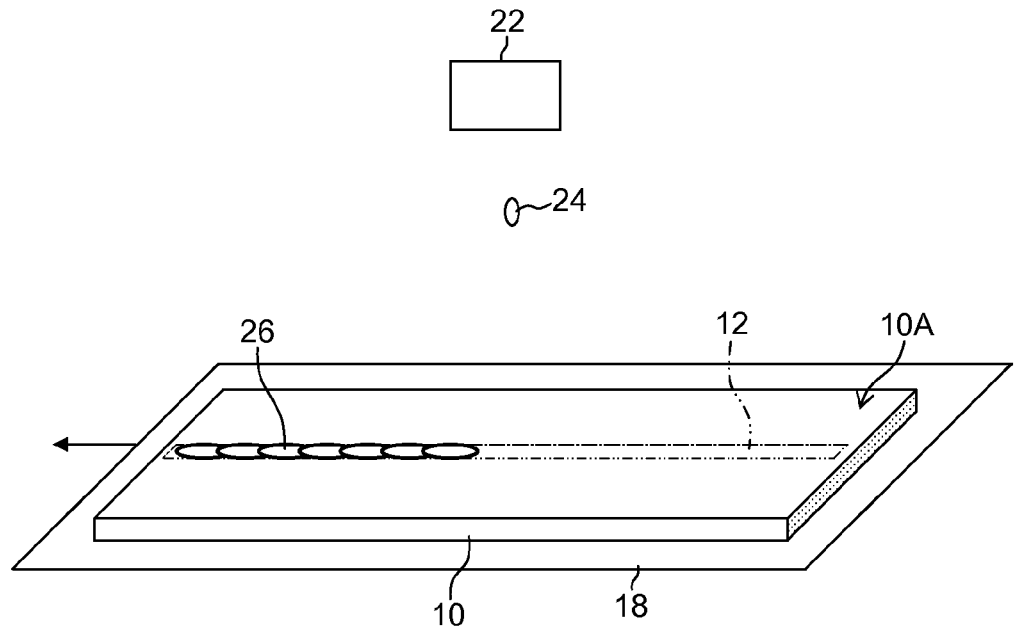
FIG. 3 is a schematic drawing of a droplet deposition processing step in a pattern forming method according to a first embodiment of the present invention.

FIG. 3 is a conceptual drawing of a droplet deposition step (pattern forming step) in the pattern forming method according to the present embodiment. The droplet deposition step shown in FIG. 3 is a step in which droplets 24 are ejected from the inkjet head 22 toward the substrate 10 after the modification treatment, and dots 26 are formed by the droplets 24 deposited on the pattern forming surface 10A of the substrate 10.

The liquid which can be used in the present step has properties (viscosity, etc.) which enable ejection by an inkjet method, and an example of such the liquid is a wiring ink, such as a dispersion of metal particles obtained by dispersing metal particles of silver (Ag), gold (Au), copper (Cu) or the like, or particles of alloy including these metals, in a prescribed solvent, or a precursor solution containing the aforementioned metal. Electric wires having a fine width of 10 μm to several ten μm can be formed by the wiring ink.

Moreover, apart from forming the electrical wiring pattern using the wiring ink as described above, it is also possible to form a mask pattern using a liquid (for example, a resist ink) obtained by dispersing insulating particles, such as resin particles, in a solvent, or to form a pattern using an electronic material ink obtained by dispersing a semiconductor or an organic EL light-emitting material, or the like, in a solvent. In this way, the pattern formation by means of the inkjet method can form a fine pattern, on demand and without mask.

FIG. 3 shows a state where the pattern is formed while the substrate 10 is moved in the prescribed movement direction (represented with an arrow in the drawing). In the direction perpendicular to the movement direction of the substrate 10, it is possible to adopt a mode in which the pattern is formed by a serial method of scanning the substrate 10 with the inkjet head 22 in the direction perpendicular to the movement direction of the substrate 10, or a mode in which a full line type of head having a plurality of nozzles arranged through the dimension (full width) of the substrate 10 in the direction perpendicular to the movement direction of the substrate 10 is provided and the pattern is formed by ejecting droplets simultaneously in this direction.

Figure 4:
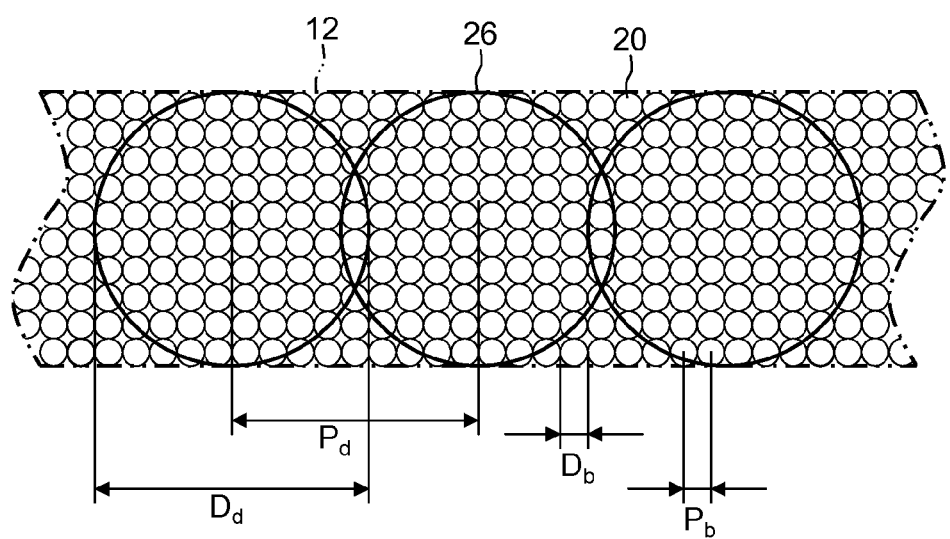
FIG. 4 is an illustrative diagram showing a schematic view of a state after ink droplet deposition in the droplet deposition step shown in FIG. 3.

FIG. 4 is an illustrative diagram showing a schematic view of a state where the dots 26 have been formed on the region where the modification treatment has been carried out. The diameter Dd of the dot 26 shown in FIG. 4 is sufficiently larger than the irradiation diameter Db of the laser light beam, and the diameter Dd of the dot 26 shown in FIG. 4 is 10 times the irradiation diameter Db of the laser light beam.

Furthermore, the pitch Pd of the dots is 10 times the irradiation pitch Pb of the laser light beam. In other words, the resolution of the dots is 1/10 of the resolution of the modification treatment. FIG. 4 shows a state where the dots 26 are deposited in such a manner that mutually adjacent dots 26 are slightly overlapping partially to each other; however, it is also possible that the dots 26 are deposited in such a manner that the overlapping portions of the mutually adjacent dots 26 are larger.

Thus, in the pattern forming method in the present embodiment, deviation in the landing positions of the dots 26 is corrected in accordance with the order of resolution of the modification treatment, by making the resolution of the modification treatment sufficiently higher (finer) than the dot resolution.

Consequently, the accuracy of the fixing positions of the dots 26 is of the order of the resolution of the modification treatment, and is sufficiently higher than when no modification treatment is carried out, and the occurrence of jaggedness and bulges caused by the positional deviation of the dots 26 is suppressed.

Furthermore, since the adhesiveness of the dots (the bonding performance between the substrate 10 and the dots 26) is raised in the region where the modification treatment has been carried out, the dots are fixed in accordance with the resolution of the modification treatment, and even if jaggedness occurs, this jaggedness is so small as to not be visible.

FIG. 4 shows the example in which the dot resolution is approximately 1/10 of the resolution of the modification treatment, and more desirably, the dot resolution can be set even lower than 1/10 of the resolution of the modification treatment, so as to make the resolution of the modification treatment relatively higher.

Figure 5:
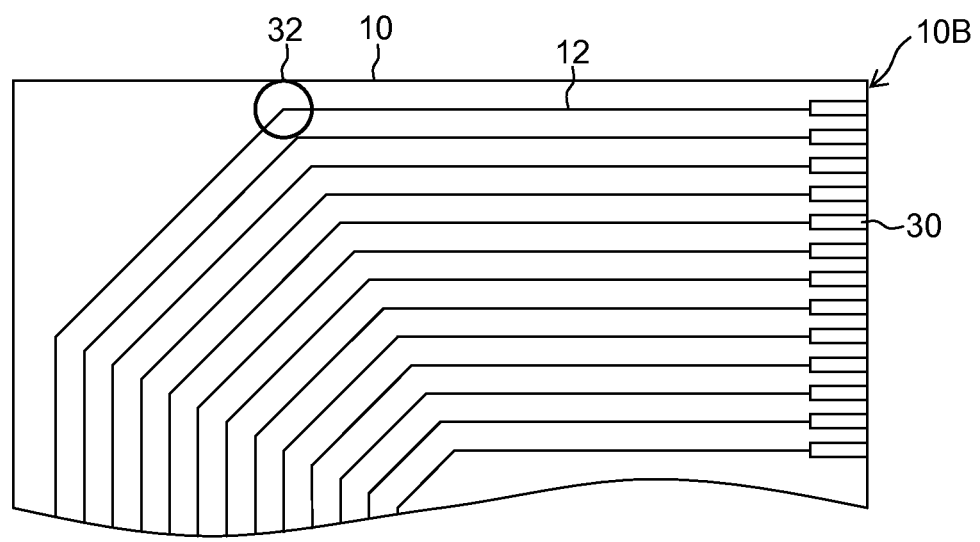
FIG. 5 is an illustrative diagram showing a wiring pattern of a wiring substrate formed by using the pattern forming method according to the first embodiment of the present invention.

FIG. 5 is a plan diagram showing the pattern forming surface of the printed wiring substrate on which the wiring pattern is formed, by applying the pattern forming method in the present embodiment.

The printed wiring substrate 10 shown in FIG. 5 has a plurality of electric wiring patterns 12, which are connected to a plurality of electrodes (pads) 30 formed on an edge portion 10B. The plurality of electrodes 30 corresponds to a card edge connector, which is attached on the edge portion 10B, and the arrangement pitch of the electrodes is 10 μm to several ten μm. The width and arrangement pitch of the wiring patterns 12 are also 10 μm to several ten μm.

Curve sections 32 of the wiring patterns 12 shown in FIG. 5 are portions where defects, such as disconnection of the pattern, are liable to occur if jaggedness or bulges arise due to deviation of the fixing positions of the dots when forming the pattern, and therefore positional accuracy of the dots is especially required in these sections.

Therefore, by adopting the pattern forming method according to the present embodiment, the occurrence of jaggedness and bulges is suppressed, and the occurrence of defects of the wiring patterns 12 in the curve sections 32 of the patterns 12 is prevented.

Figure 6:
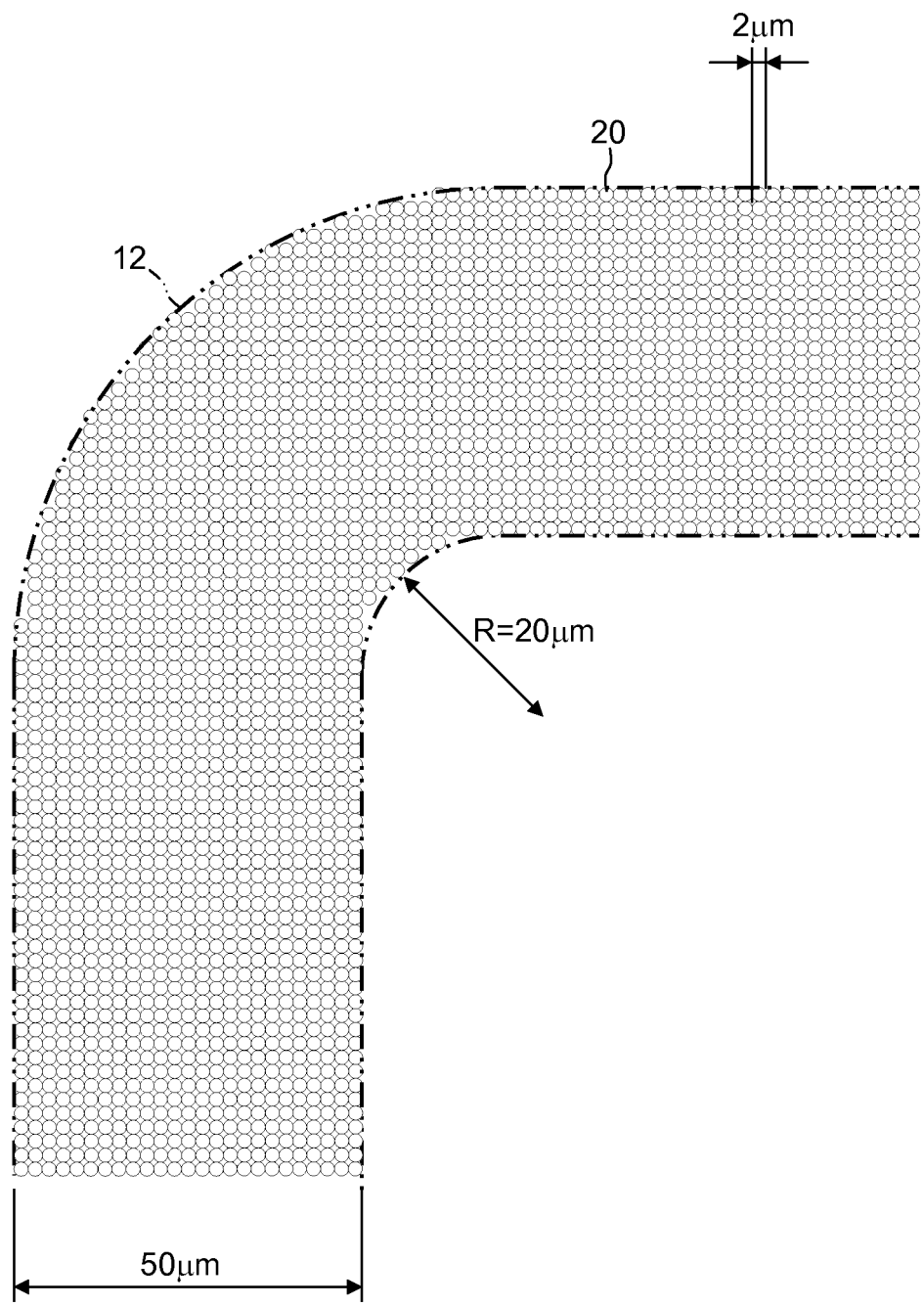
FIG. 6 is an illustrative diagram showing a schematic view of a state after the modification treatment in the vicinity of a curve section of the wiring pattern shown in FIG. 5.

FIG. 6 shows a schematic view of the state where the modification treatment has been carried out on the curve section 32 of the wiring pattern 12 shown in FIG. 5.

The wiring pattern 12 (curve section 32) shown in enlarged view in FIG. 6 has the radius of curvature of R of 20 μm and the wire width of 50 μm. FIG. 5 shows the case where the curving angle of the curve sections 32 is approximately 45°, and FIG. 6 shows the case of an extreme shape of the curve section 32, in which the curving angle is approximately 90°.

Moreover, the substrate 10 (see FIG. 5) is a PET film substrate having the thickness of 0.1 mm, and the modification energy is provided by a laser light beam having the output of 100 mJ/cm$^2$, the wavelength of 405 nm, and the beam diameter Db of 2 μm.

Furthermore, a gas containing oxygen (which can be air) is used for the reactive gas, and the treatment target region after the modification treatment (the region where the dots 26 (see FIG. 4) are deposited) has the strong affinity to the liquid.

As shown in FIG. 6, since the modification treatment is carried out at the resolution that is sufficiently higher (approximately 10 times higher in the example in FIG. 6) than the dot resolution, then even if there is some degree of omissions in the modification treatment with respect to the curves of the pattern 12 (even if there are portions where the circles indicating the modified portions are not present), the modification resolution substantially the same as that of the linear portions, which is sufficient in practical terms, is obtained in the edges of the curve section 32 of the pattern.

Figure 7:
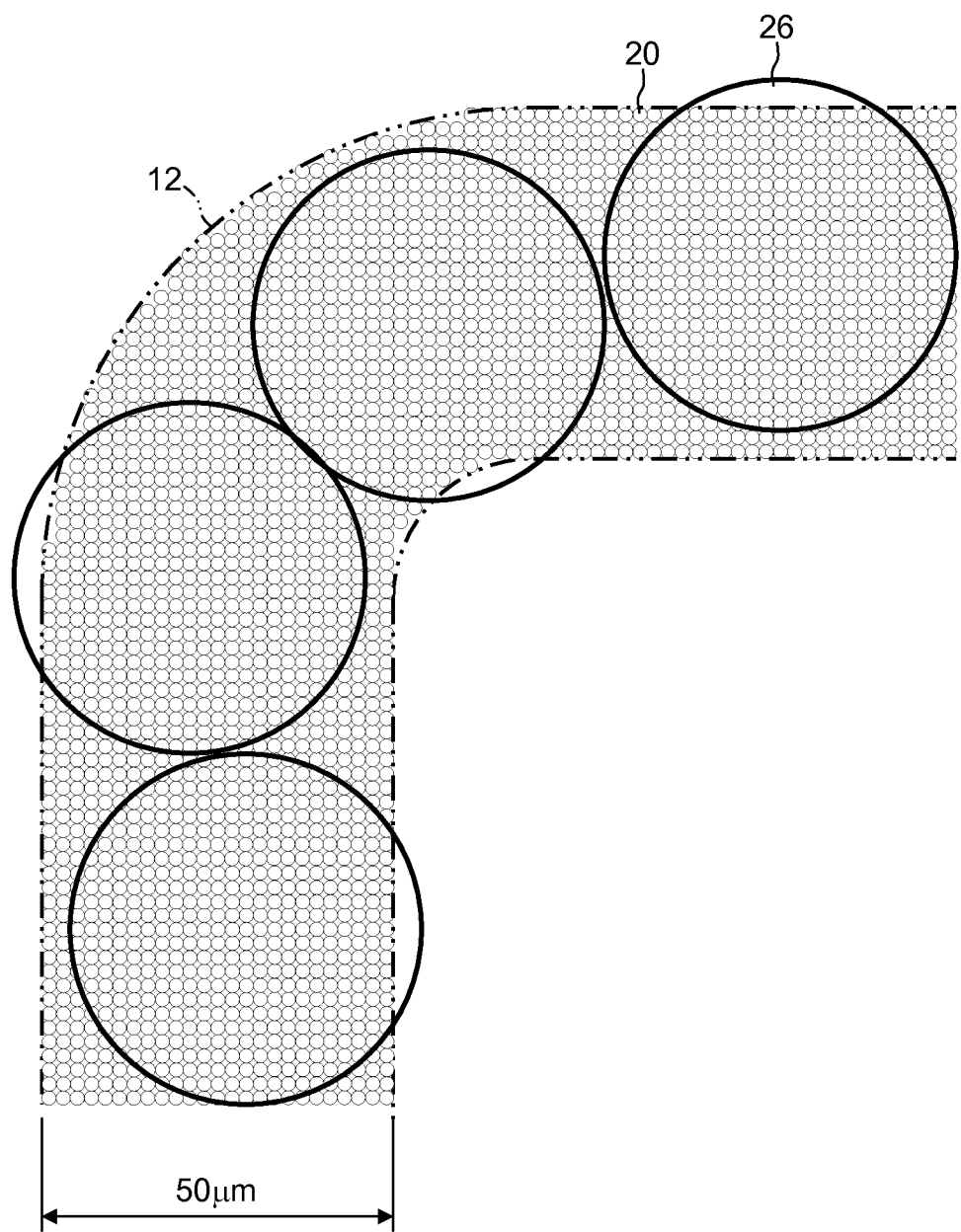
FIG. 7 is an illustrative diagram showing a schematic view of a state after the droplet deposition in the vicinity of the curve section of the wiring pattern shown in FIG. 5.

FIG. 7 is an illustrative diagram showing a schematic view of a state where droplets of silver ink (or copper ink) are deposited on the substrate 10 after the modification treatment (the liquid-affinity enhancement treatment). Moreover, FIGS. 8A and 8B are illustrative diagrams (cross-sectional diagrams) showing schematic views of state changes in the droplets (dots) 26 after landing.

Figure 8A:
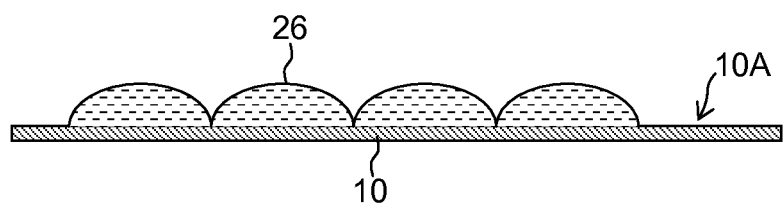
FIG. 8A is an illustrative diagram of change in the shape of dots after the droplet deposition.
Figure 8B:
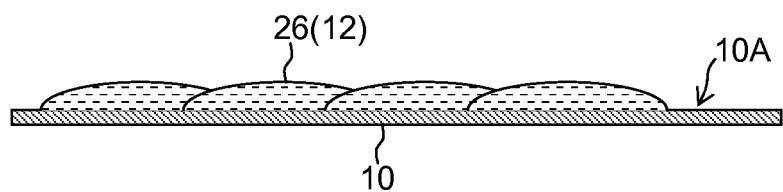
FIG. 8B is an illustrative diagram of change in the shape of dots after the droplet deposition.

As shown in FIG. 8A, the droplet (dot) 26 immediately after the landing has a hemispherical shape, and as time passes, the droplet wets and spreads radially from the center, and the diameter of the droplet becomes larger, while the height thereof becomes lower.

Figure 9:
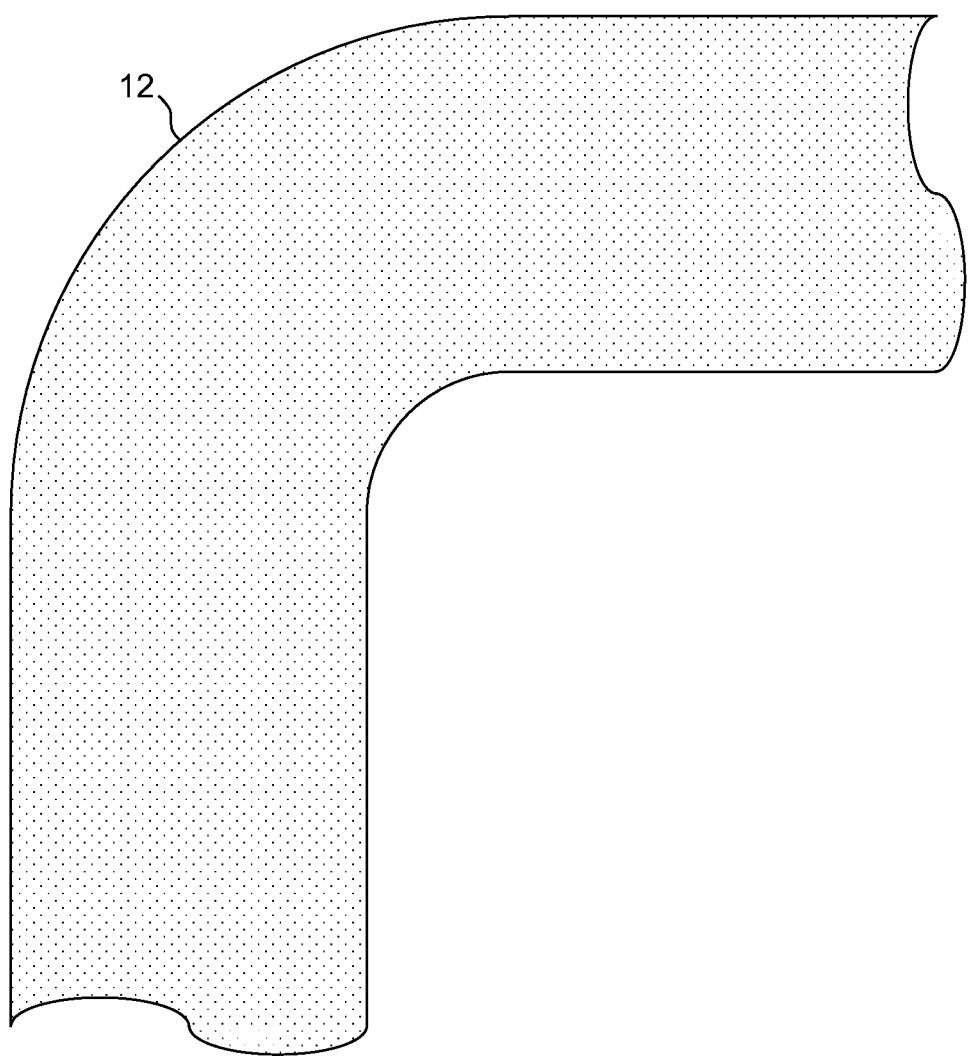
FIG. 9 is an illustrative diagram showing a final state of the vicinity of the curve section of the wiring pattern shown in FIG. 5.

In the example shown in FIG. 8A, the diameter of the dot 26 upon landing is 30 μm and the stabilized diameter of the dot after wetting and spreading is 50 μm. As shown in FIG. 8B, when the dot 26 that has wet and spread becomes in contact with another dot 26 which has landed at an adjacent position, the dots 26 are drawn to each other due to their respective surface tensions and combine together as shown in FIG. 8B, whereby the wiring pattern 12 as shown in FIG. 9 is formed.

More specifically, even if positional deviation occurs as shown in FIG. 7 at the landing positions of the droplets (dots) 26, and even if the dots 26 which have wet and spread project out into a region where the modification treatment has not been carried out, the dots 26 are drawn to the region having the strong affinity to the liquid where the modification treatment has been carried out.

Moreover, if the adjacent dots combine together, then the dots 26 follow the pattern (irradiation pattern) where the modification treatment has been carried out and the dots 26 forming the wiring pattern 12 are kept within the region having the strong affinity to the liquid where the modification treatment has been carried out, and do not project out into the unmodified region.

Furthermore, since the resolution of the modification treatment is sufficiently higher than the dot resolution, then the jaggedness which occurs at the edges of the pattern follows the edge shape of the modification treatment region and is not conspicuous, and hence the quality of the wiring pattern (in particular, the edge portions of the wiring pattern) is improved.

By making the treatment resolution in the modification treatment sufficiently higher than the dot resolution of the pattern image formation in this way, the accuracy of the fixing positions of the droplets (dots) is improved, and the quality of the pattern can be improved.

In particular, the shapes of the edge portions of the formed pattern are stable, and the pattern free of jaggedness is obtained, thereby achieving even higher image formation quality.

Moreover, by adopting the laser light beam as the modification energy, it becomes possible to achieve highly efficient modification treatment by means of high energy, and fast modification treatment of high quality becomes possible, regardless of the material and shape of the substrate.

Further, by suitably selecting the reactive gas that is introduced into the modification treatment atmosphere, it is possible to select the contents of the modification treatment, and hence the process can be adapted to substrates of various materials and liquids having various properties. Furthermore, since the bonding force between the dots (pattern) and the substrate is increased, then the droplets can be fixed more accurately to a smooth surface, and the formed pattern becomes less liable to peeling apart, even if the substrate is bent, as well as improving durability.

Examples of manufactured products which are manufactured by employing the pattern forming method in the present embodiment are: printed wiring substrates, flexible wiring substrates, flexible organic EL displays (organic EL display panels), electronic paper, solar battery panels, and the like.

For example, using the pattern forming method in the present embodiment, it is possible to manufacture a TFT array in which the TFT pitch is approximately 10 μm×100 μm to 200 μm×200 μm, the minimum wire width of the gate wire and source wire is 40 μm, the space is 20 μm, the minimum wire width of the source electrode is 20 μm and the channel width is 5 μm.

The pattern forming method in the present embodiment can also be applied to the formation of semiconductor layers or other mask patterns for forming these electric wire patterns and elements. The pattern forming method in the present embodiment can be adopted in a portion of the steps for manufacturing the manufactured products described above, and can also be combined with steps relating to other techniques.

<Description of Pattern Forming Apparatus>

Next, an apparatus composition for achieving the pattern forming method described above is explained.

Figure 10:
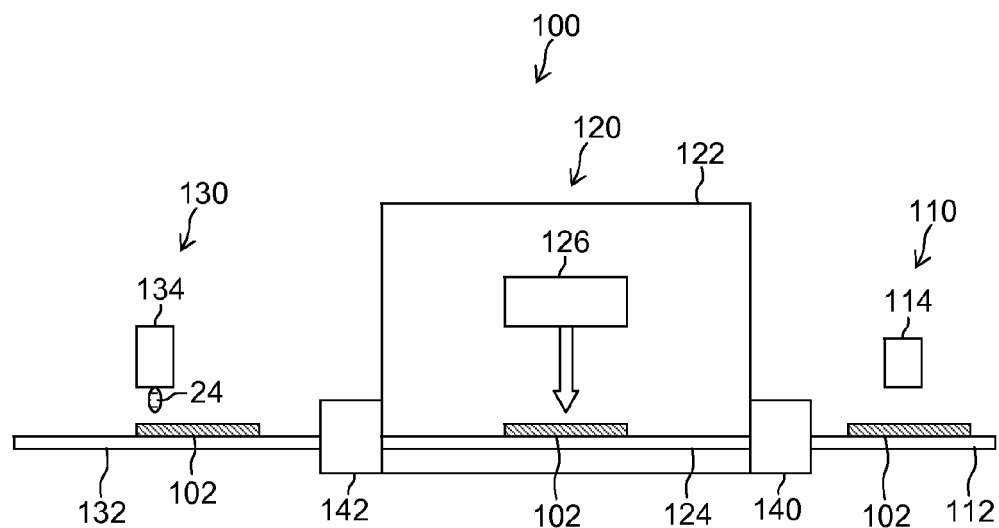
FIG. 10 is a general schematic drawing showing the general composition of a pattern forming apparatus according to the first embodiment of the present invention.

FIG. 10 is a general schematic drawing of a pattern forming apparatus 100 according to an embodiment of the present invention. The pattern forming apparatus 100 shown in FIG. 10 includes: a distortion determination unit 110, which determines distortion of a substrate 102; a modification treatment unit 120, which carries out modification treatment on the substrate 102; and a pattern forming unit (inkjet ejection unit) 130, which forms a fine pattern on the substrate 102 after the modification treatment.

The distortion determination unit 110 is constituted of a conveyance mechanism 112, which supports the substrate 102, and a sensor 114, which determines distortion of the substrate 102. The conveyance mechanism 112 moves the substrate 102 in a prescribed direction while holding the substrate 102 in a prescribed attitude, in the detection region of the sensor 114. The conveyance mechanism 112 can adopt a mode which conveys the substrate 102 in one direction, or a mode which conveys the substrate 102 in two mutually perpendicular directions (for example, the X and Y directions).

The sensor 114 employs an optical detection system including a light source, such as a semiconductor laser, LED, or the like, and an imaging element, such as a CCD. More specifically, the sensor 114 captures an image of alignment marks, which are previously arranged on the substrate 102 (not shown in FIG. 10, and shown and denoted with reference numeral 303 in FIG. 20), and this imaging signal is sent to the control system (shown in detail in FIG. 18).

In the control system, distortion of the substrate 102 itself and distortion of the image formation are determined on the basis of the determination signal (imaging signal) obtained from the sensor 114, pattern correction data is generated so as to cancel out the distortion, and modification treatment correction data corresponding to the pattern correction data is also generated. More specifically, correction corresponding to the distortion of the substrate 102 before the pattern formation is carried out on demand.

The "distortion of the substrate" referred to herein includes distortion of the image formation, in addition to distortion of the substrate 102 itself. The distortion of the substrate 102 itself can include, for instance, cases where the substrate 102 has deviated in the longitudinal direction or the lateral direction from a prescribed position, or has deviated in the height direction or rotated, and so on.

Moreover, the distortion of the image formation can include, for instance, cases where the image formation shape is enlarged or reduced, or is distorted in a trapezoidal shape.

It is also possible to adopt a mode where the distortion of a fixed substrate is determined while two-dimensionally moving the sensor 114, or a mode where distortion of the substrate is determined while relatively moving both the substrate 102 (conveyance mechanism 112) and the sensor 114.

The function of the distortion determination unit 110 described above can also be composed as a distortion determination step in the pattern forming method described previously. More specifically, the pattern forming method described above can be composed to include a distortion determination step of determining distortion of the substrate 10, and a correction data generation step of generating correction data for the modification treatment and correction data for the pattern formation which correspond to the distortion of the substrate 10 determined by the distortion determination step, in which the modification treatment step and the pattern forming step are carried out on the basis of the correction data.

The modification treatment unit 120 includes: a chamber 122, into which a prescribed reactive gas is filled; a conveyance mechanism 124, which holds the substrate 102 and moves the substrate 102 in a prescribed movement direction inside the chamber 122; and a light application head 126, which irradiates a prescribed region of the substrate 102 with a laser light beam.

Figure 11:
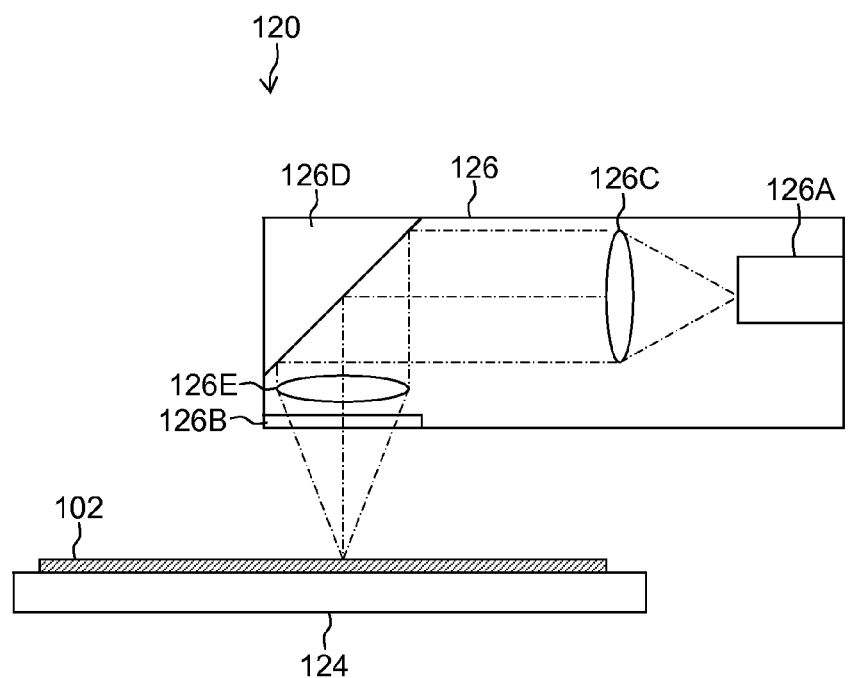
FIG. 11 is a schematic drawing showing an approximate composition of the modification treatment unit shown in FIG. 10.

FIG. 11 is a schematic drawing showing the approximate composition of the light application head 126. The light application head 126 shown in FIG. 11 includes: a laser oscillator 126A; a shutter mechanism 126B; a collimator lens 126C; a lens system 126D, which adjusts the beam of laser light; and a front end optical system (mirror, lens, etc.) 126E for applying the laser light beam of a required spot diameter onto the target irradiation surface, and the light application head 126 is composed so as to apply a light spot having a prescribed irradiation diameter onto the substrate.

In the present embodiment, the serial method is employed in which the substrate 102 is scanned with the light application head 126 in the direction perpendicular to the movement direction of the substrate 102, the modification treatment is carried out in the region where the modification treatment is possible in one scanning action in this direction, and when one modification treatment action in this scanning direction has been completed, the substrate 102 is then moved by a prescribed amount and the modification treatment is carried out in the next region, the whole surface of the substrate 102 being subjected to the modification treatment by repeating this operation.

Of course, it is also possible to adopt a mode in which, instead of scanning the substrate 102 with the light application head 126, the substrate 102 is scanned with the laser light beam by using a scanning optical system. It is also possible to adopt a mode in which a plurality of light spot ends are arranged through the full width of the substrate 102 and the laser light beams are simultaneously applied onto the whole width of the substrate 102 while moving the substrate 102.

The pattern forming unit 130 shown in FIG. 10 includes a conveyance mechanism 132, which holds the substrate 102 and moves the substrate 102 in a prescribed direction, and an inkjet head 134. The substrate 102 on which the prescribed pattern has been formed by depositing the droplets ejected from the inkjet head 134 is output through a substrate output unit (not shown).

The pattern forming apparatus 100 shown in FIG. 10 also includes: a transfer unit 140, which transfers the substrate 102 between the distortion determination unit 110 and the modification treatment unit 120; and a transfer unit 142, which transfers the substrate 102 between the modification treatment unit 120 and the pattern forming unit 130.

Figure 12:
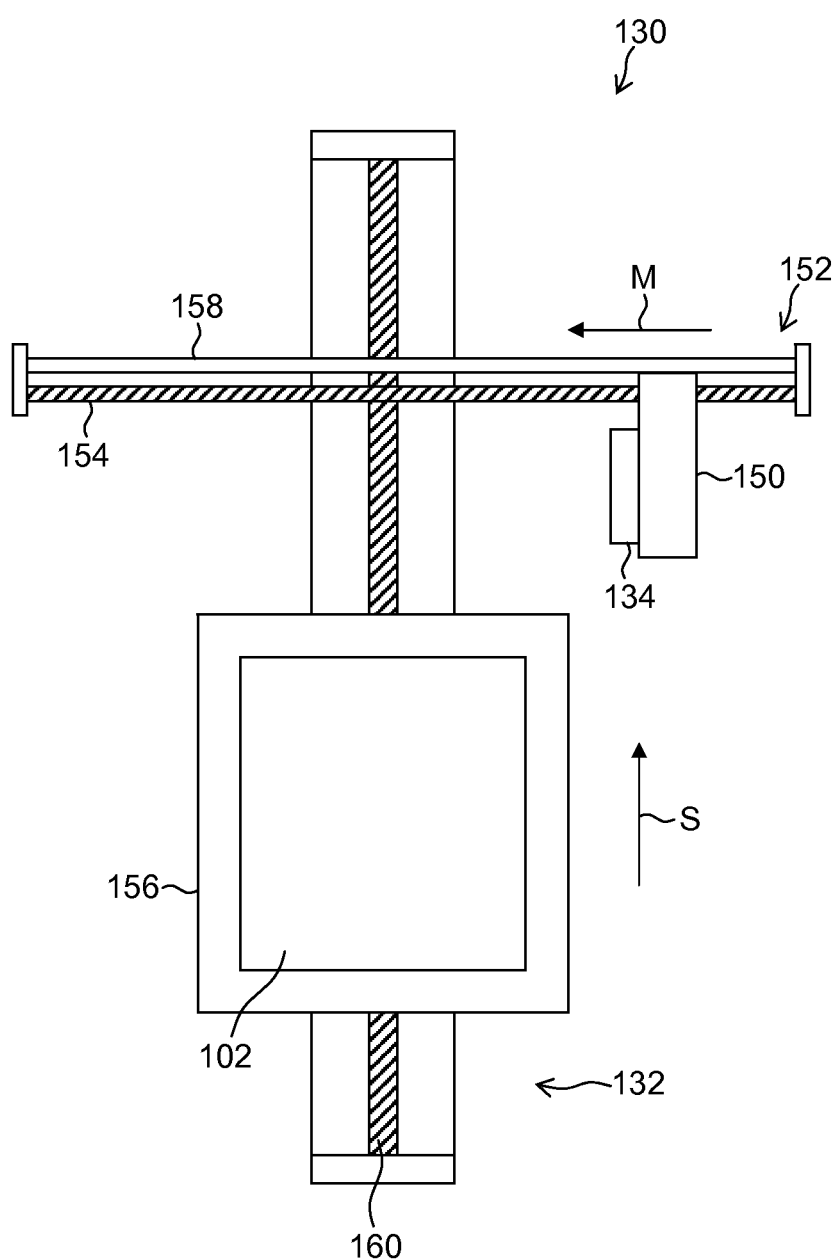
FIG. 12 is a schematic drawing showing an approximate composition of the pattern forming unit shown in FIG. 10.

FIG. 12 is a schematic drawing showing one mode of the pattern forming unit 130. The pattern forming unit 130 shown in FIG. 12 employs the serial method as the scanning method performed by the inkjet head 134.

More specifically, the pattern forming unit 130 includes: a scanning mechanism 152, which moves a carriage 150, on which the inkjet head 134 is mounted, along the main scanning direction M; and the conveyance mechanism 132, which moves a stage 156 supporting the substrate 102 along the sub-scanning direction S.

The scanning mechanism 152 shown in FIG. 12 employs a ball screw 154 as a feed mechanism for the carriage 150 and employs a guide member 158 as a supporting member of the carriage 150. The conveyance mechanism 132 employs a ball screw 160 as a feed mechanism for the stage 156.

It is also possible to employ a linear actuator, such as a linear slider, or to employ an xy table, instead of the ball screw 160.

Figure 13A:
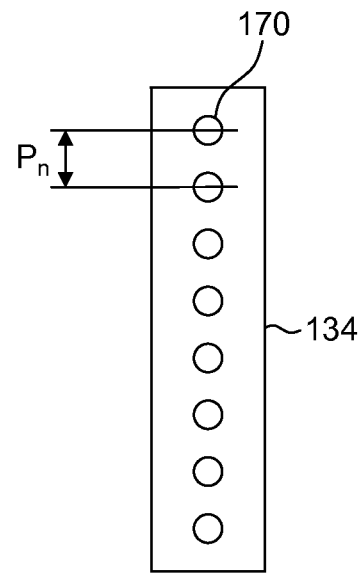
FIG. 13A is a diagram for describing a nozzle arrangement in an inkjet head which is applied to the pattern forming unit shown in FIG. 10.

FIG. 13A is a plan view diagram of a nozzle surface of the inkjet head 134 showing a nozzle arrangement in the inkjet head 134. As shown in FIG. 13A, the inkjet head 134 has a structure in which a plurality of nozzles 170 are arranged in one row at an arrangement pitch Pn in the sub-scanning direction (the vertical direction in FIG. 13A).

Figure 13B:
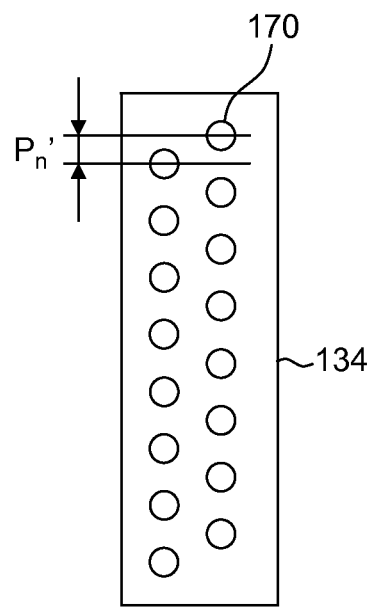
FIG. 13B is a diagram for describing a nozzle arrangement in an inkjet head which is applied to the pattern forming unit shown in FIG. 10.
Figure 17:
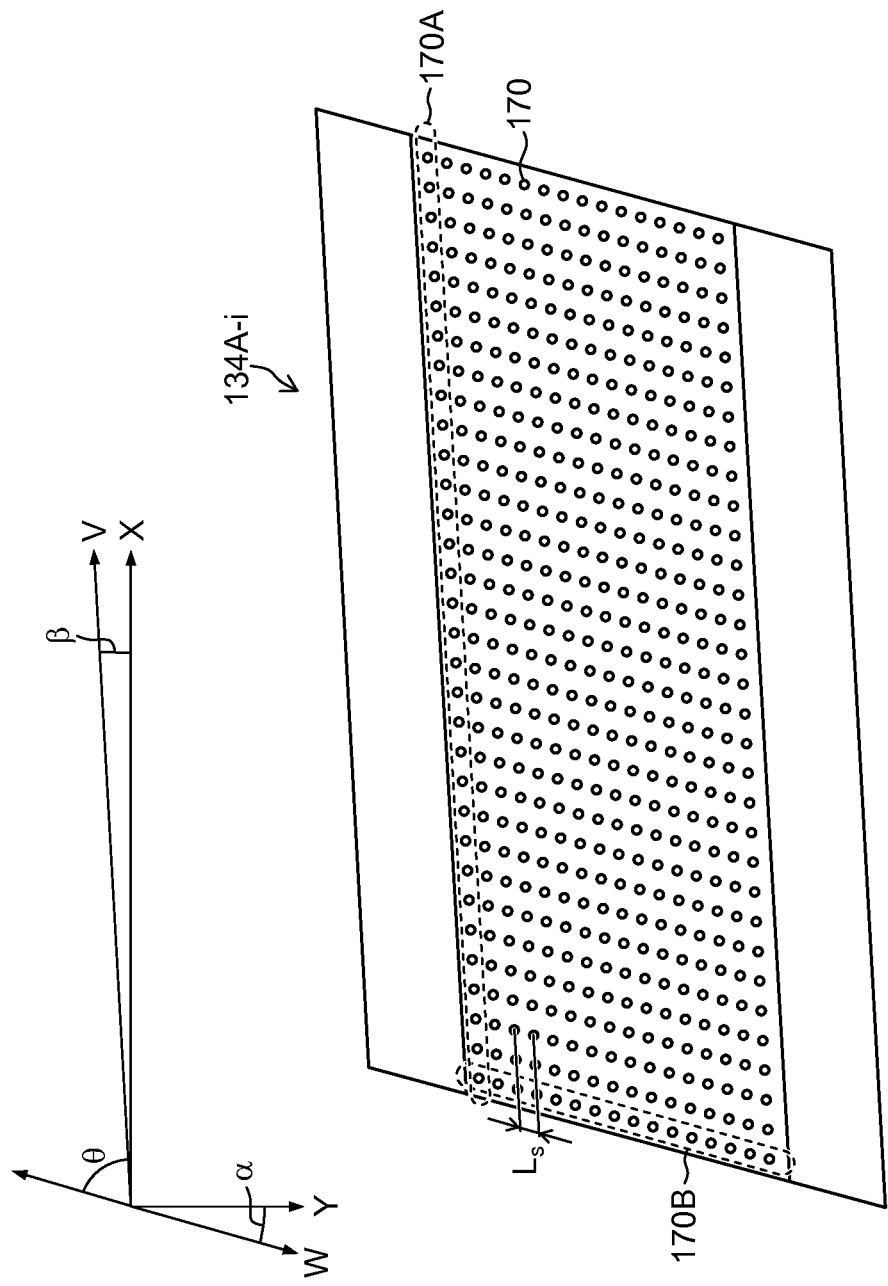
FIG. 17 is a diagram illustrating a nozzle arrangement of the line head shown in FIG. 16.

In order to reduce the arrangement pitch of the nozzles 170 so as to raise the density of the nozzle arrangement in the inkjet head 134, it is possible to arrange the nozzles 170 in a staggered configuration as shown in FIG. 13B, or to arrange the nozzles 170 in a matrix configuration (see FIG. 17). The effective arrangement pitch Pn' of the nozzles 170 in the staggered configuration shown in FIG. 13B is ½ of the arrangement pitch Pn of the nozzles 170 shown in FIG. 13A.

Figure 14:
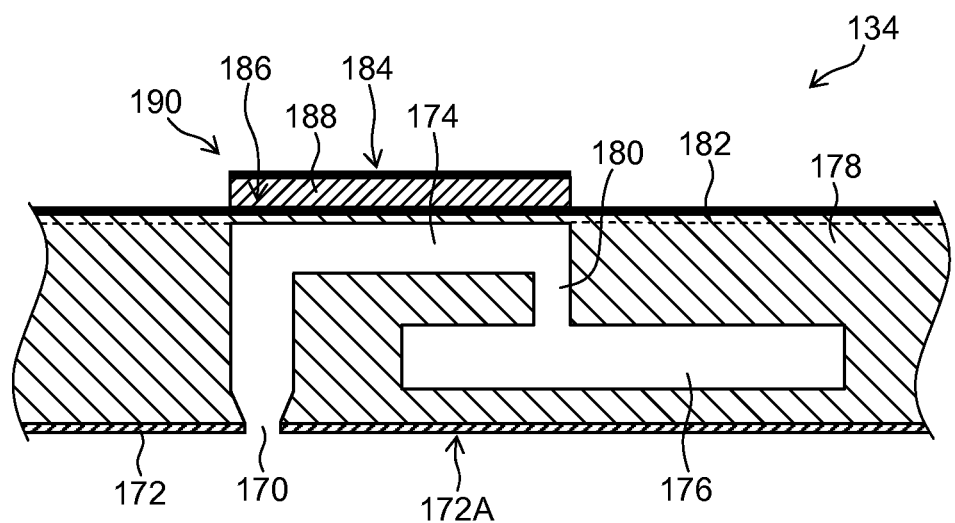
FIG. 14 is a cross-sectional diagram showing an inner structure of the inkjet head shown in FIG. 10.

FIG. 14 is a cross-sectional diagram showing the inner structure of a droplet ejection element of one channel which is one unit of the recording elements constituting the inkjet head 134 (i.e., an ink chamber unit corresponding to one nozzle 170).

As shown in FIG. 14, the inkjet head 134 according to the present embodiment has a structure in which a nozzle plate 172 in which the nozzles 170 are formed, and a flow channel plate 178 in which flow channels, such as pressure chambers 174 and a common flow channel 176, and the like, are formed, are layered and bonded together.

The nozzle plate 172 forms a nozzle surface 172A of the inkjet head 134 and the nozzles 170 connecting respectively with the pressure chambers 174 are formed in the nozzle plate 172 in one row along the sub-scanning direction (see FIG. 13A).

The flow channel plate 178 is a flow channel forming member, which constitutes side wall portions of the pressure chambers 174 and in which supply ports 180 are formed to serve as restricting sections (most constricted portions) of individual supply channels for guiding the ink to the respective pressure chambers 174 from the common flow channel 176.

For the purpose of the description, FIG. 14 shows a simplified composition, and the flow channel plate 178 can have a structure composed by one substrate, or can have a structure composed by laminating together a plurality of substrates. Each of the nozzle plate 172 and the flow channel plate 178 can be processed into a desired shape by a semiconductor manufacturing process using silicon as a material.

The common flow channel 176 is connected to an ink tank (not shown), which is a base tank that supplies the ink, and the ink supplied from the ink tank is supplied through the common flow channel 176 to the pressure chambers 174.

Piezoelectric actuators (piezoelectric elements) 190 are bonded to a diaphragm 182 which constitutes portions of the faces of the pressure chambers 174 (the ceiling face in FIG. 14). Each of the piezoelectric actuators 190 includes an upper electrode (individual electrode) 184 and a lower electrode 186, and has a structure in which a piezoelectric body 188 is placed between the upper electrode 184 and the lower electrode 186.

If the diaphragm 182 is constituted of a metal thin film or a metal oxide film, then the diaphragm 182 also functions as a common electrode, which corresponds to the lower electrodes 186 of the piezoelectric actuators 190. In a mode in which the diaphragm is made from a non-conductive material, such as resin, a lower electrode layer made of a conductive material, such as metal, is formed on the surface of the diaphragm material.

When a drive voltage is applied to the upper electrode 184, the piezoelectric actuator 190 deforms, thereby changing the volume of the pressure chamber 174. This causes a pressure change which results in the ink being ejected from the nozzle 170.

When the piezoelectric actuator 190 returns to its original position after the ink ejection, the pressure chamber 174 is replenished with new ink from the common flow channel 176 through the supply port 180.

A thermal method can be employed as the ejection method of the inkjet head 134 in the present embodiment. Although detailed description of the thermal method is omitted here, in the thermal method, the liquid inside a liquid chamber is heated when a drive signal is applied to a heater arranged inside the liquid chamber and a droplet of a prescribed volume is ejected from a nozzle by utilizing a film boiling phenomenon of the liquid inside the chamber.

Figure 15:
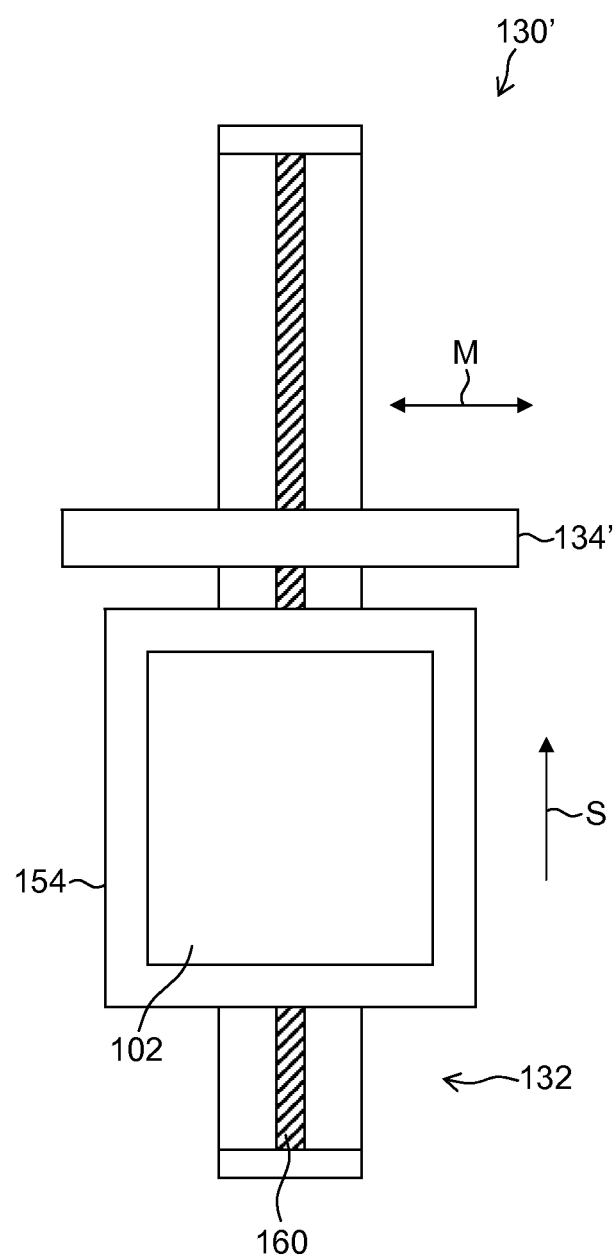
FIG. 15 is a general schematic diagram showing a further example of the composition of the pattern forming unit shown in FIG. 12.

FIG. 15 is a schematic drawing showing a further mode of the pattern forming unit 130 shown in FIG. 12. The pattern forming unit 130' shown in FIG. 15 is equipped with a full line type of inkjet head 134' instead of the serial type of inkjet head 134.

The full line type of inkjet head 134' has a structure in which the nozzles 170 (see FIG. 17) are arranged through a length corresponding to the entire length of the substrate 102 in the main scanning direction M. Image formation can be carried out over the whole area of the substrate 102 by relatively moving the inkjet head 134' and the substrate 102 just once in the sub-scanning direction S.

Figure 16:
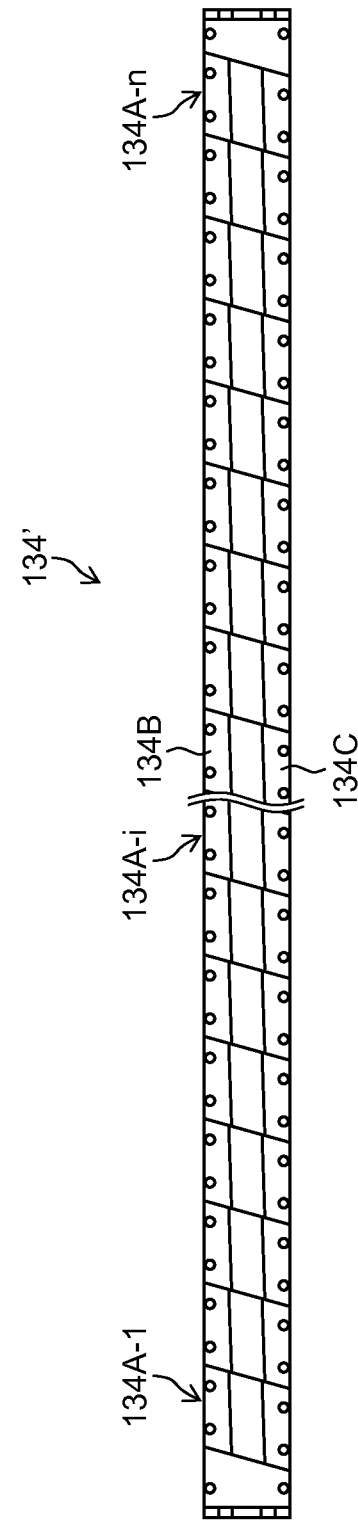
FIG. 16 is a plan view perspective diagram showing a composition of the line head shown in FIG. 15.

FIG. 16 is a plan view perspective diagram showing an example of the composition of the full line type of inkjet head 134' (in a viewing direction from the inkjet head 134' toward the substrate 102), and FIG. 17 is a diagram illustrating a nozzle arrangement of the inkjet head 134' shown in FIG. 16.

The inkjet head 134' shown in FIG. 16 constitutes a multiple head by joining together n head modules 134A-i (where i is an integer from 1 to n) in one row in the lengthwise direction of the inkjet head 134'.

The head modules 134A-i are supported by head covers 134B and 134C from either side of the width direction of the inkjet head 134'. It is also possible to constitute a multiple head by arranging the head modules 134A in a staggered configuration.

The fine pattern 12 (see FIG. 4) can be formed over the whole surface of the substrate 10 by a so-called single pass method in which the pattern formation is carried out by scanning the recording medium relatively just once with the inkjet head 134' having this structure.

The head modules 134A-i which constitute the inkjet head 134' have a substantially parallelogram-shaped planar form, as shown in FIG. 17, and overlap sections are provided between the adjacent sub-heads.

The overlap section is a joint section between the sub-heads, in which dots which are adjacent in the direction of alignment of the head modules 134A-i are formed by the nozzles belonging to different sub-heads.

As shown in FIG. 17, each head module 134A-i has a structure in which the nozzles 170 are arranged in a two-dimensional configuration, and the head that includes the head modules 134A-i of this kind is known as a so-called matrix head.

The head module 134-i shown in FIG. 17 has a structure in which the nozzles 170 are arranged in a column direction W that forms an angle $\alpha$ with respect to the sub-scanning direction Y (the direction denoted with the reference symbol S in FIG. 15), and a row direction V that forms an angle $\beta$ with respect to the main scanning direction X (the direction denoted with the reference symbol M in FIG. 15), thereby achieving a high density of the effective nozzle arrangement in the main scanning direction X.

In FIG. 17, a nozzle group (nozzle row) arranged in the row direction V is labeled with the reference numeral 170A, and a nozzle group (nozzle column) arranged in the column direction W is labeled with the reference numeral 170B.

A further example of a matrix configuration of the nozzles 170 is a composition in which the nozzles 170 are arranged in a row direction following the main scanning direction X and a column direction which is an oblique direction with respect to the main scanning direction X.

Figure 18:
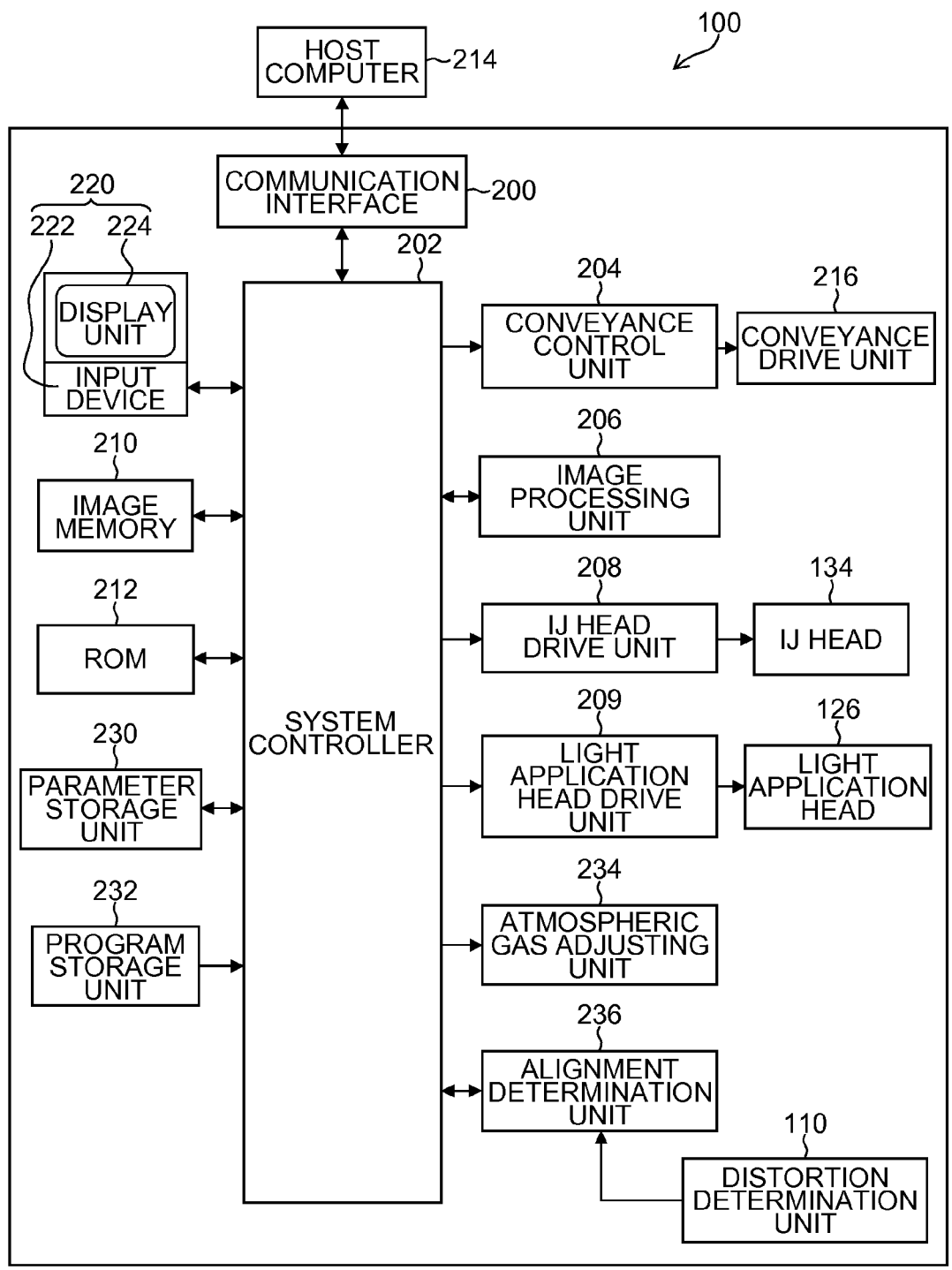
FIG. 18 is a block diagram showing a composition of a control system of the pattern forming apparatus shown in FIG. 10.

FIG. 18 is a block diagram showing the approximate composition of a control system of the pattern forming apparatus 100. The pattern forming apparatus 100 includes a communication interface 200, a system controller 202, a conveyance controller 204, an image processing unit 206, an inkjet (IJ) head drive unit 208, a light application head drive unit 209, an image memory 210 and a ROM 212.

The communication interface 200 is an interface unit for receiving image data which is transmitted by a host computer 214. The communication interface 200 can employ a serial interface, such as a USB (Universal Serial Bus), or a parallel interface, such as a Centronics device.

It is also possible to install a buffer memory (not shown) for achieving high-speed communications in the communication interface 200.

The system controller 202 is constituted of a central processing unit (CPU) and peripheral circuits of same, and the like, and functions as a control device which controls the whole of the pattern forming apparatus 100 in accordance with a prescribed program, as well as functioning as a calculating device which performs various calculations and also functioning as a memory controller for the image memory 210 and the ROM 212.

More specifically, the system controller 202 controls the various sections, such as the communication interface 200, the conveyance control unit 204, and the like, as well as controlling communications with the host computer 214 and reading and writing to and from the image memory 210 and the ROM 212, and the like, and generating control signals which control the respective units described above.

Image data sent from the host computer 214 is input to the pattern forming apparatus 100 through the communication interface 200, and prescribed image processing is carried out by the image processing unit 206.

The image processing unit 206 is a control unit which has signal (image) processing functions for carrying out various treatments, corrections and other processing in order to generate a signal for controlling image formation from the image data, and which supplies the generated image formation data to the inkjet head drive unit 208 and the light application head drive unit 209.

Prescribed signal processing is carried out in the image processing unit 206, and the ejecting droplet volume (depositing droplet volume) and the ejection timing of the inkjet head 134 are controlled through the inkjet head drive unit 208 on the basis of the image data.

By this means, a desired dot size and dot arrangement are achieved. The inkjet head drive unit 208 shown in FIG. 18 can also include a feedback control system for maintaining uniform drive conditions in the inkjet head 134.

The light application head drive unit 209 generates a control signal for the modification treatment (modification treatment data) on the basis of the signal for controlling the image formation generated by the image processing unit 206. The irradiation conditions of the laser light and the scanning conditions of the light application head 126, and the like, are determined by the modification treatment data.

The conveyance control unit 204 controls the conveyance timing and conveyance speed of the substrate 102 (see FIG. 10) on the basis of the image formation control signal generated by the image processing unit 206.

A conveyance drive unit 216 in FIG. 18 includes a motor which drives the ball screw 154 in FIG. 12, a motor which drives the ball screw 160, a drive motor of the conveyance mechanism which conveys the substrate 102 in the distortion determination unit 110 shown in FIG. 10, and a drive motor of the conveyance mechanism which conveys the substrate 102 in the modification treatment unit 120, and the like. In other words, the conveyance control unit 204 has a function as a driver for the motors described above.

The image memory (primary storage memory) 210 has the functions of a temporary storage device for temporarily storing image data input through the communication interface 200, as well as the functions of a development area for various programs stored in the ROM 212 and a calculation work area for the CPU (for example, a work area for the image processing unit 206). A volatile memory (RAM) which can be read from and written to sequentially is used as the image memory 210.

The ROM 212 is a storage device which stores programs that are executed by the CPU of the system controller 202 and various data and control parameters, and the like, which are required for controlling the respective units of the apparatus. Data is read from and written to the ROM 212 through the system controller 202.

The ROM 212 is not limited to a memory constituted of semiconductor elements, and can also employ a magnetic medium, such as a hard disk. Furthermore, the apparatus can also include an external interface which connects to the system controller 202 and can use a storage medium that can be attached to and detached from this external interface, as the ROM 212.

The pattern forming apparatus 100 in the present embodiment includes a user interface 220. The user interface 220 is constituted of an input device 222 for the operator (user) to make various inputs and a display unit (display) 224.

The input device 222 can employ various modes, such as a keyboard, mouse, touch panel, buttons, or the like. The operator is able to enter print conditions, select image quality mode, enter and edit associated information, search for information, and the like, by operating the input device 222. Furthermore, the operator can also check various information, such as the input contents and search results, etc., through the display on the display unit 224.

The display unit 224 also functions as a device which displays warnings, such as error messages. The display unit 224 in FIG. 18 can be used as a display for a reporting device which reports the occurrence of an abnormality.

A parameter storage unit 230 is a storage device which stores various control parameters that are necessary for the operation of the pattern forming apparatus 100. The system controller 202 reads out the parameters required for control, as and when required, from the parameter storage unit 230, and also executes updating (rewriting) of various parameters stored in the parameter storage unit 230.

A program storage unit 232 is a storage device which stores control programs for operating the pattern forming apparatus 100.

A atmospheric gas adjusting unit 234 is a control block for adjusting the atmosphere inside the chamber 122, such as the density of the reactive gas (fill volume) which is filled into the chamber 122 shown in FIG. 10, in accordance with the instruction signal from the system controller 202. If the pattern forming apparatus 100 is composed in such a manner that a plurality of reactive gases can be filled selectively into the chamber 122, then the atmospheric gas adjusting unit 234 controls the expulsion and filling of the reactive gas.

A alignment position determination unit 236 is a block which generates distortion information relating to the substrate 102 (see FIG. 10) (and distortion information relating to image formation) on the basis of the determination signal obtained from the distortion determination unit 110 (sensor 114).

The distortion information relating to the substrate 102 is sent from the alignment position determination unit 236 to the image processing unit 206 through the system controller 202. The image processing unit 206 generates correction data for irradiation (modification treatment) and correction data for image formation, on the basis of the distortion information relating to the substrate 102.

For example, if the position of the substrate 102 has been rotated with respect to the prescribed position, then the amount of this rotation is calculated, and furthermore, pattern correction data is generated on demand so as to cancel out the rotation, and the irradiation correction data corresponding to the pattern correction data is also generated on demand.

Here, "correction data" includes irradiation data and dot data for image formation (position information about the dots constituting the pattern) which has been subjected to shift processing (correction of deviation in the planar direction), offset processing (correction of deviation in the thickness direction) and rotational processing, or enlargement processing, reduction processing, trapezoid correction processing (processing for correcting a pattern which has distorted to a trapezoid shape, back into a square shape).

Thus, the modification treatment unit 120 and the pattern forming unit 130 have the common feedback loop and are composed in such a manner that irradiation correction and image formation correction are carried out on the basis of the same (common) distortion information relating to the substrate 102 obtained from the distortion determination unit 110.

According to the pattern forming method and the pattern forming apparatus composed as described above, the accuracy of the modification treatment is improved by making the resolution of the modification treatment, which is the irradiation resolution of the laser light beam, sufficiently larger than the dot resolution of the pattern formation (image formation).

Consequently, since the accuracy of the fixing positions of the dots which form the pattern is improved, then the occurrence of jaggedness and bulges is prevented. Moreover, the bonding force between the substrate and the pattern is increased, the pattern is not liable to peel away, even if the substrate is bent, and the durability of the pattern is improved.

Moreover, since the corrected data for the modification treatment and the corrected data for the image formation are generated on demand on the basis of the distortion information relating to the substrate 102 and the image formation which has been obtained from the distortion determination unit 110, then the optimal modification treatment and pattern formation are achieved in accordance with the individual differences between the substrates.

Furthermore, by selecting the type of reactive gas introduced into the atmosphere during the modification treatment, the modification treatment corresponding to the type of substrate and the type of the liquid is performed, and the pattern formation is carried out under conditions suited to the substrates and the liquids of various types.

In the present embodiment, the mode is described in which the electrical wiring pattern is formed on the substrate; however, the present invention can also be applied to graphic printing on a sheet-shaped medium, such as paper or resin. More specifically, the pattern forming method and apparatus according to the present invention can also be applied to an image forming apparatus which forms a desired image after carrying out the modification treatment on the surface of a graphic printing medium.

<Application Example>

Next, a pattern forming method according to an application example of the present invention is described. In the pattern forming method according to the present application example, the modification treatment step is changed from the pattern forming method according to the above-described embodiments. In the following description, parts which are the same as or similar to the parts described above are denoted with the same reference numerals and further explanation thereof is omitted here.

Figure 19:
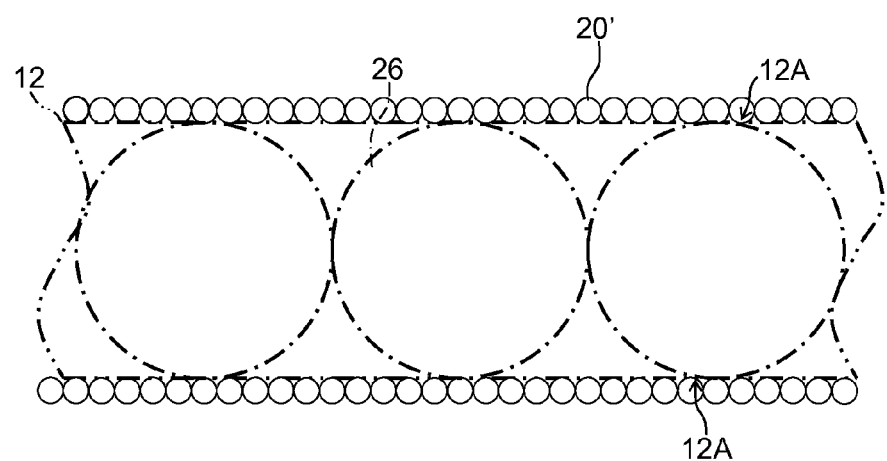
FIG. 19 is an illustrative diagram of a pattern forming method according to an adapted embodiment of the first embodiment of the present invention.

FIG. 19 is an illustrative drawing of a modification treatment step which is employed in the pattern forming method according to the present embodiment. As shown in FIG. 19, in the modification treatment step in the present embodiment, the outer sides of outer edge portions 12A of the fine pattern 12 are irradiated with the laser light beam (the irradiation portions of the laser light beam are denoted with reference numeral 20'), and the dots 26 are formed inside the region where the modification treatment has been carried out.

If the fine pattern 12 is to be formed by a liquid using water as the solvent, then hydrophobization treatment is applied to the outer sides of the outer edge portions 12A of the pattern 12, and if the pattern 12 is to be formed by a liquid using an organic solvent, then hydrophilization treatment is applied to the outer sides of the outer edge portions 12A of the pattern 12.

The modification treatment is carried out so as to border the outer sides of the outer edge portions 12A of the pattern 12, by taking the edge portions of a negative pattern corresponding to the fine pattern 12 to be formed on the substrate 10 (see FIG. 1) as the modification treatment region.

In so doing, even if the dots (liquid) 26 land and project to the outside of the outer edge portions 12A of the fine pattern 12, the regions which have undergone the modification treatment (the irradiation portions of the laser light beam denoted with reference numeral 20') form barriers, and the dots 26 are drawn into the portion which is enclosed on either side by the regions that have undergone the modification treatment.

Moreover, by carrying out the modification treatment only in the vicinity of the outer sides of the outer edge portions 12A of the fine pattern 12, rather than carrying out the modification treatment over the whole surface of the region where the fine pattern 12 is not to be formed, the treatment time of the modification treatment step is shortened. Furthermore, since the modification treatment is carried out at the resolution that is sufficiently higher than the dot resolution, then the fixing positions of the dots 26 are stabilized, and the accuracy of the fixing positions is improved.

FIG. 19 shows the region having the width of the spot diameter Db of the laser light beam (see FIG. 4), as one example of the vicinity of the outer sides of the outer edge portions 12A of the fine pattern 12.

Of course, it is also possible to combine the pattern forming methods described with reference to FIGS. 1 to 9. More specifically, when the pattern 12 is to be formed by liquid which uses water as a solvent, by carrying out hydrophobization treatment on the outer edge portions 12A of the pattern 12 and also carrying out hydrophilization treatment to the inner side of the inner edges of the pattern 12, the dots 26 are drawn to the inner side including the inner edge portions of the pattern 12 and the dots 26 are prevented from projecting beyond the outer sides of the outer edge portions 12A of the pattern and becoming fixed outside the pattern.

In the present embodiment, the method and apparatus are described in which the pattern image formation is carried out to create a wiring pattern or a mask pattern on a substrate; however, the present invention can be applied to graphic printing for forming an image on a recording medium, such as paper, or to the manufacture of a fine panel, such as an organic EL panel, and similar beneficial effects can be obtained in this case.

<Second Embodiment>

Figure 20:
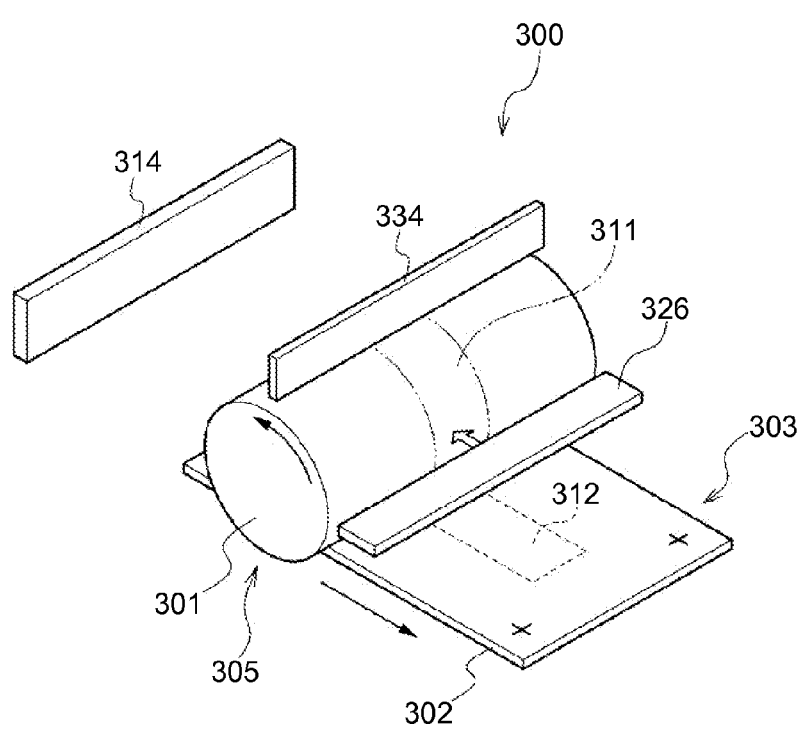
FIG. 20 is a perspective diagram showing the general composition of a pattern forming apparatus according to a second embodiment of the present invention.
Figure 21:
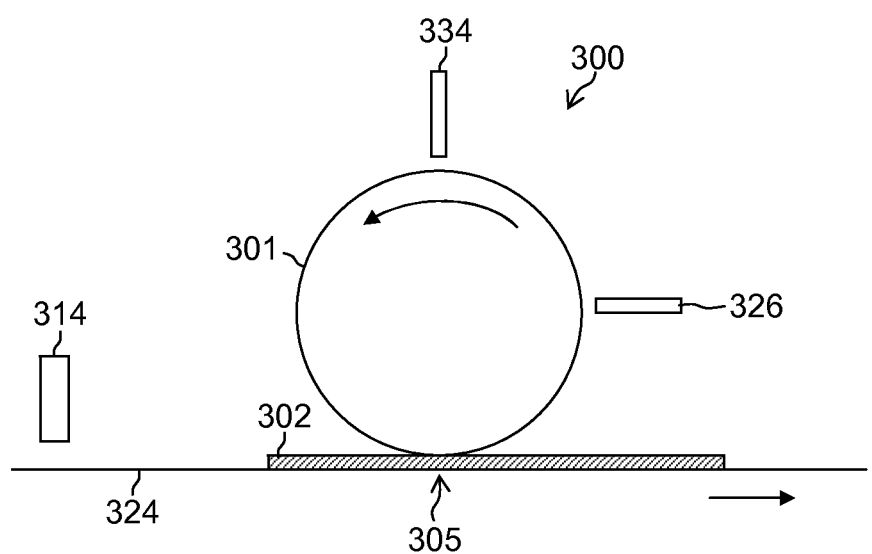
FIG. 21 is a side view diagram of the pattern forming apparatus shown in FIG. 20 as viewed from a side of a side surface of the conveyance drum.

Next, a second embodiment of the present invention is described. FIG. 20 is a perspective diagram showing an approximate composition of a pattern forming apparatus 300 according to the second embodiment of the present invention, and FIG. 21 is a side view diagram showing the pattern forming apparatus 300 depicted in FIG. 20 as viewed from a side of a side face of a conveyance drum 301.

The pattern forming apparatus 300 according to the present embodiment includes: a light application head 326, which carries out modification treatment on an outer circumferential surface of the transfer drum 301 (base body); an inkjet head 334, which is arranged so as to eject and deposit droplets of liquid (liquid containing functional material), such as wiring ink or resin ink, onto the outer circumferential surface of the transfer drum 301 which has undergone the modification treatment; a sensor 314, which determines distortion of a substrate 302; and a conveyance mechanism (shown and denoted with reference numeral 324 in FIG. 21), which conveys the substrate 302.

In other words, the pattern forming apparatus 300 described in the present embodiment is of a so-called intermediate transfer type, and is composed so as to transfer a pattern that has been formed on the outer circumferential surface of the transfer drum 301 (the pattern which is a mirror image of the pattern to be formed on the substrate 302), onto the substrate 302.

Distortion of the substrate 302 is determined by the sensor 314, and the irradiation data and image formation data are corrected so as to cancel out the distortion of the substrate 302 that has been determined. Marks (denoted with reference numeral 303 in FIG. 20) arranged in the four corners of the substrate 302 are alignment marks 303, which provide the references for determining the distortion of the substrate 302.

The light application head 326 is arranged at a prescribed distance away from the outer circumferential surface of the transfer drum 301, in such a manner that the laser light emitting surface faces the outer circumferential surface of a transfer drum 301.

The inkjet head 334 is arranged in such a manner that the ink ejection surface faces the outer circumferential surface of the transfer drum 301, on the downstream side of the light application head 326 in terms of the direction of rotation of the transfer drum 301.

The distance between each of the light application head 326 and the inkjet head 334, and the outer circumferential surface of the transfer drum 301, is the same as in the embodiment shown in FIG. 10.

FIGS. 20 and 21 show a state where the inkjet head 334 is arranged at the position facing the uppermost portion of the transfer drum 301 and the light application head 326 is arranged at the position distanced by 90° from the inkjet head 334 when converted to the angle of rotation of the transfer drum 301. However, the arrangement is not limited to this, and provided that the inkjet head 334 is arranged on the downstream side of the light application head 326 in terms of the direction of rotation of the transfer drum 301 (the counter-clockwise direction indicated with an arrow), it is possible to change the arrangement of the light application head 326 and the inkjet head 334 appropriately.

In FIG. 20, a region enclosed by double-dotted lines and denoted with reference numeral 311 is the modification treatment region which has been irradiated with the laser light by the light application head 326. The inkjet head 334 ejects and deposits the droplets onto the modification treatment region 311.

The pattern formed by the droplets which have been ejected and deposited by the inkjet head 334 is provisionally cured so as to prevent movement on the outer circumferential surface of the transfer drum 301, and is then conveyed to a transfer unit 305, which is positioned in the bottommost portion of the transfer drum 301.

After distortion of the substrate 302 has been determined by the sensor 314, the substrate 302 is conveyed to the transfer unit 305 in synchronism with the pattern formed on the outer circumferential surface of the transfer drum 301. More specifically, in the transfer unit 305, the positions of the leading end of the pattern forming region on the substrate 302 and the leading end of the pattern forming region on the outer circumferential surface of the transfer drum 301 are aligned.

Thereupon, the substrate 302 is pressed against the outer circumferential surface of the transfer drum 301 and the pattern formed on the outer circumferential surface of the transfer drum 301 is transferred to the substrate 302. The pattern which has been transferred to the substrate 302 is indicated by the broken line denoted with reference numeral 312.

The modification treatment region which has passed through the transfer unit 305 is subjected to a cleaning process on the downstream side of the transfer unit 305 in terms of the direction of rotation of the transfer drum 301. If there is no change in the pattern (if a plurality of substrates 302 are to be formed bearing the same patterns), then a pattern is formed by droplets which are ejected and deposited by the inkjet head 334, on the modification treatment region which has been subjected to the cleaning process.

The composition of the pattern forming apparatus 300, such as the sensor 314, the light application head 326, the inkjet head 334, and the like, shown in FIGS. 20 and 21, the irradiation conditions of the light application head 326 (the beam diameter and the irradiation resolution), the droplet deposition conditions of the inkjet head 334 (the dot diameter and the dot resolution), and so on, can be applied with the same composition and the same conditions as the above-described pattern forming apparatus 100 shown in FIG. 10.

Figure 22:
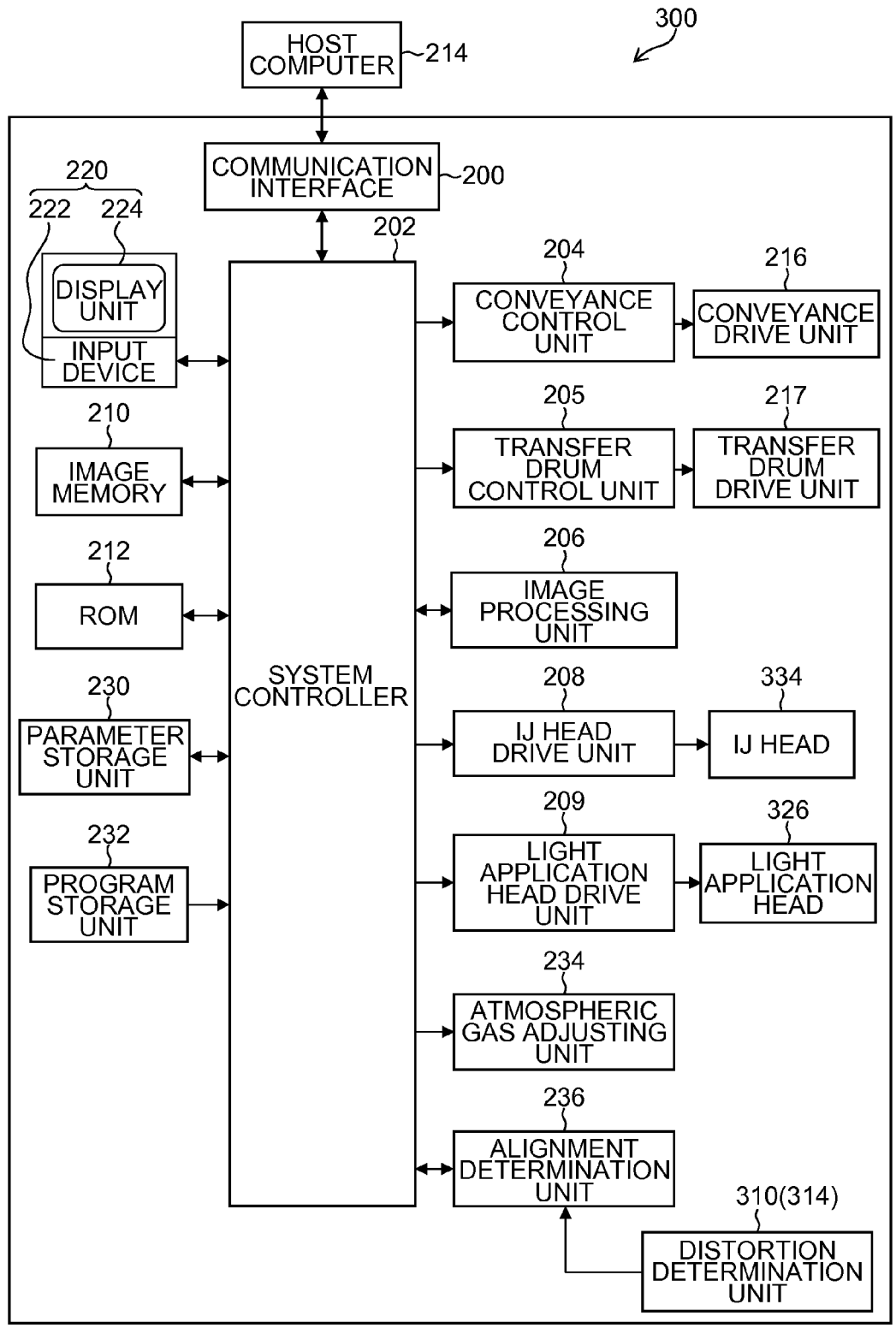
FIG. 22 is a block diagram showing a composition of a control system of the pattern forming apparatus shown in FIG. 20.

FIG. 22 is a block diagram showing the composition of the control system of the pattern forming apparatus 300 shown in FIGS. 20 and 21. The block diagram shown in FIG. 22 corresponds to the block diagram shown in FIG. 18 added with a transfer drum control unit 205 and a transfer drum drive unit 217.

The transfer drum control unit 205 generates a control signal for controlling the rotation and halting, and the speed of rotation, etc., of the transfer drum 301 shown in FIG. 20, on the basis of an instruction signal sent from the system controller 202. The control signal is sent to the transfer drum drive unit 217 and the operation of the motor for driving the transfer drum 301 which is included in the transfer drum drive unit 217 is controlled on the basis of the control signal. In other words, the transfer drum control unit 205 has a function as a driver for the motor for driving the transfer drum 301.

If the same patterns are formed on the plurality of substrates 302 (if the same patterns are formed on the outer circumferential surface of the transfer drum 301 a plurality of times), then the modification treatment can be carried out on the outer circumferential surface of the transfer drum 301 at least the first time that the pattern is formed on the outer circumferential surface of the transfer drum 301.

Moreover, the modification treatment can also be carried out on the outer circumferential surface of the transfer drum 301, as appropriate, the second and subsequent times that the pattern is formed on the outer circumferential surface of the transfer drum 301.

When the pattern formed on the substrate (and on the outer circumferential surface of the transfer drum 301) is changed, after carrying out restoration processing of the outer circumferential surface of the transfer drum 301, the modification treatment is carried out on the outer circumferential surface of the transfer drum 301 on the basis of the changed image data.

Concrete examples of restoration processing include: physical processing such as replacing the outer circumferential surface of the transfer drum 301, polishing the outer circumferential surface of the transfer drum 301, or the like, or chemical processing or electrical processing of the transfer drum 301, or the like.

For example, there can be cases where processing by a doctor blade, or processing by corona discharge, and the like, is carried out on the outer circumferential surface of the transfer drum 301. There can also be cases where the restoration processing of the outer circumferential surface of the transfer drum 301 is not necessary.

Since the modification treatment performed on the outer circumferential surface of the transfer drum 301 is applied to the outermost surface up to a depth of 0.1 μm in the diameter direction of the transfer drum 301, from the outer circumferential surface of the transfer drum 301, then it is possible to simultaneously achieve both good bonding force of the pattern and good efficiency of the restoration processing.

The range of the modification treatment in the thickness direction can also be adapted to the mode where a pattern is formed directly on the surface of a substrate.

According to the pattern forming apparatus and method according to the second embodiment, in the fine pattern forming that employs the intermediate transfer method, since the modification treatment is carried out at the resolution sufficiently higher than the dot resolution on the outer circumferential surface of the transfer drum 301, and droplets are deposited in the portion where the modification treatment has been carried out, then it is possible to obtain similar beneficial effects to the direct image formation method, in that the accuracy of the modification treatment is improved, the accuracy of the fixing positions of the dots forming the pattern is improved, and hence the occurrence of jaggedness and bulges is prevented, and furthermore bending strength and durability are improved due to increased bonding force between the substrate and the pattern.

<Third Embodiment>

Figure 23:
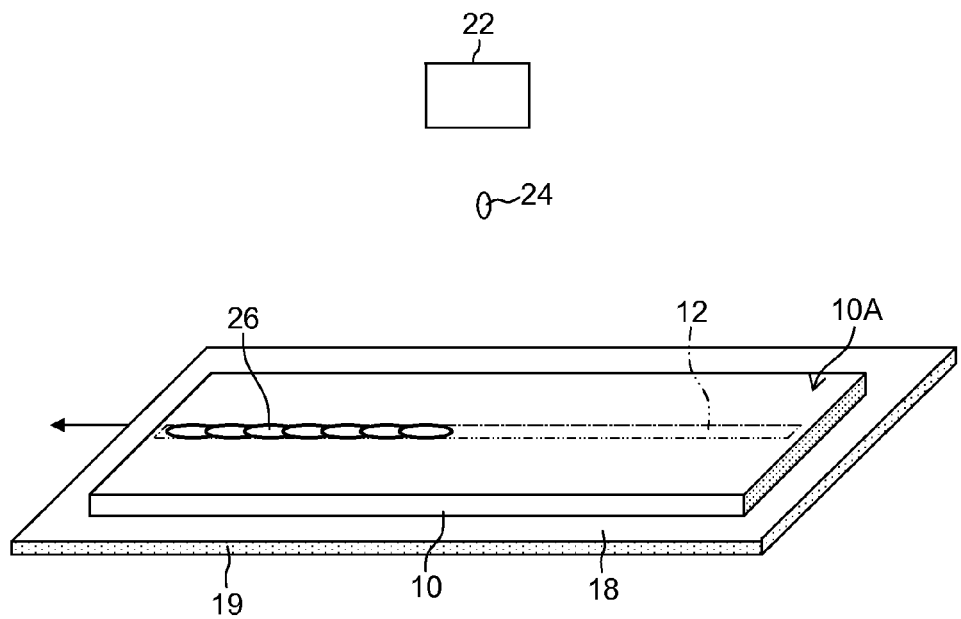
FIG. 23 is a schematic drawing of a droplet deposition processing step in a pattern forming method according to a third embodiment of the present invention.

Next, a third embodiment of the present invention is described. FIG. 23 is a conceptual drawing of a droplet deposition processing step in the pattern forming method according to the third embodiment. In the following description, parts which are the same as or similar to the parts described above are denoted with the same reference numerals and further explanation thereof is omitted here.

The droplet deposition processing step shown in FIG. 23 includes a temperature control step which controls temperature of the substrate 10 (the pattern forming surface 10A). FIG. 23 shows a mode where the substrate 10 is heated by a heater 19 from the rear surface (the surface reverse to the pattern forming surface 10A) of the substrate 10.

Instead of the heater 19 shown in FIG. 23, it is also possible to adopt a mode which includes a Peltier element or a mode which heats the substrate 10 from the side of the pattern forming surface 10A of the substrate 10. Moreover, a desirable mode is one which includes a fan for cooling the pattern forming surface 10A of the substrate 10.

By suitably adjusting the temperature of the substrate 10, it is also possible to vary the shape (thickness, diameter) of the dot 26. For example, if the droplet 24 (dot 26) is placed in a high temperature state immediately after landing, then the curing of the dot 26 is speeded up and therefore wetting and spreading of the dot is suppressed and the dot 26 having a large thickness and a small diameter is formed. On the other hand, if the droplet 24 (dot 26) is placed in a low temperature state, the curing of the dot 26 is slowed down, and therefore the dot 26 sets and spreads considerably, and the dot 26 having a small thickness and a large diameter is formed. Since the relationship between the temperature of the dot 26 and the curing speed varies depending on the type of the liquid, it is desirable to beforehand ascertain and store the relationship between the temperature and the cured state of the dot, for each type of liquid used.

Although not shown in the drawings, a desirable mode is one in which the temperature of the substrate 10 is controlled in the modification treatment step shown in FIG. 1. The modification treatment can be promoted by heating the substrate 10 during the modification treatment and after the modification treatment.

Figure 24:
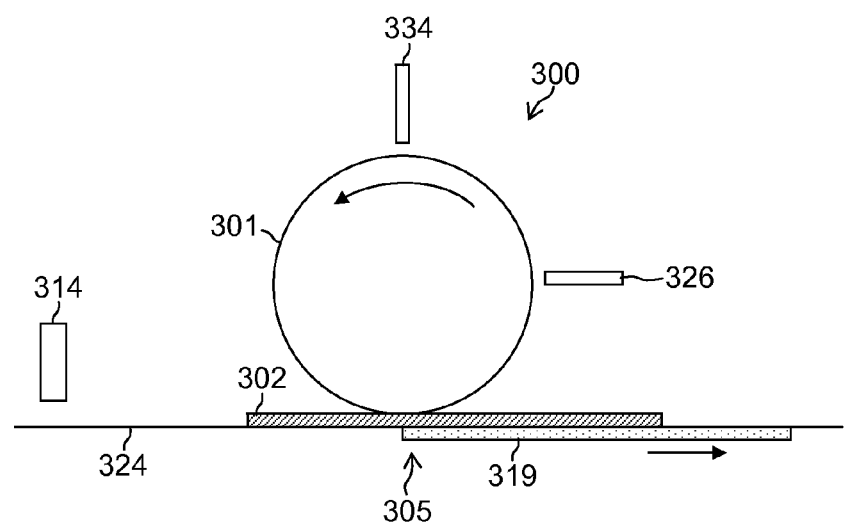
FIG. 24 is an illustrative diagram of a further example of the composition of the pattern forming apparatus shown in FIG. 23.

FIG. 24 is an illustrative diagram showing an example where the intermediate transfer method is applied to the pattern forming method according to the third embodiment. As shown in FIG. 24, a heater 319 is incorporated in the conveyance mechanism 324, which conveys the substrate 302, so as to heat the substrate 302 after the transfer of the pattern.

In the intermediate transfer method, the viscosity of the droplets (dots 26) which have landed on the outer circumferential surface of the transfer drum 301 can be controlled by controlling the temperature of the transfer drum 301 after the pattern formation.

For example, if the dot 26 is kept in a high viscosity state by placing the dot 26 in a high temperature state (e.g., in a case of the liquid including resin particles, not lower than the glass transition temperature of the resin particles), from the landing of the dot 26 on the outer circumferential surface of the transfer drum 301 until the transfer of the dot 26 to the transfer unit 305, and the temperature of the dot 26 is then lowered (e.g., to be lower than the glass transition temperature) so as to lower the viscosity of the dot 26 when the dot 26 is transferred by the transfer unit 305, then the pattern can be transferred readily to the substrate 302.

This mode can be achieved by incorporating a heater into the transfer drum 301 and suitably controlling the amount of heating provided by the heater, while measuring the temperature of the outer circumferential surface of the transfer drum 301.

Figure 25:
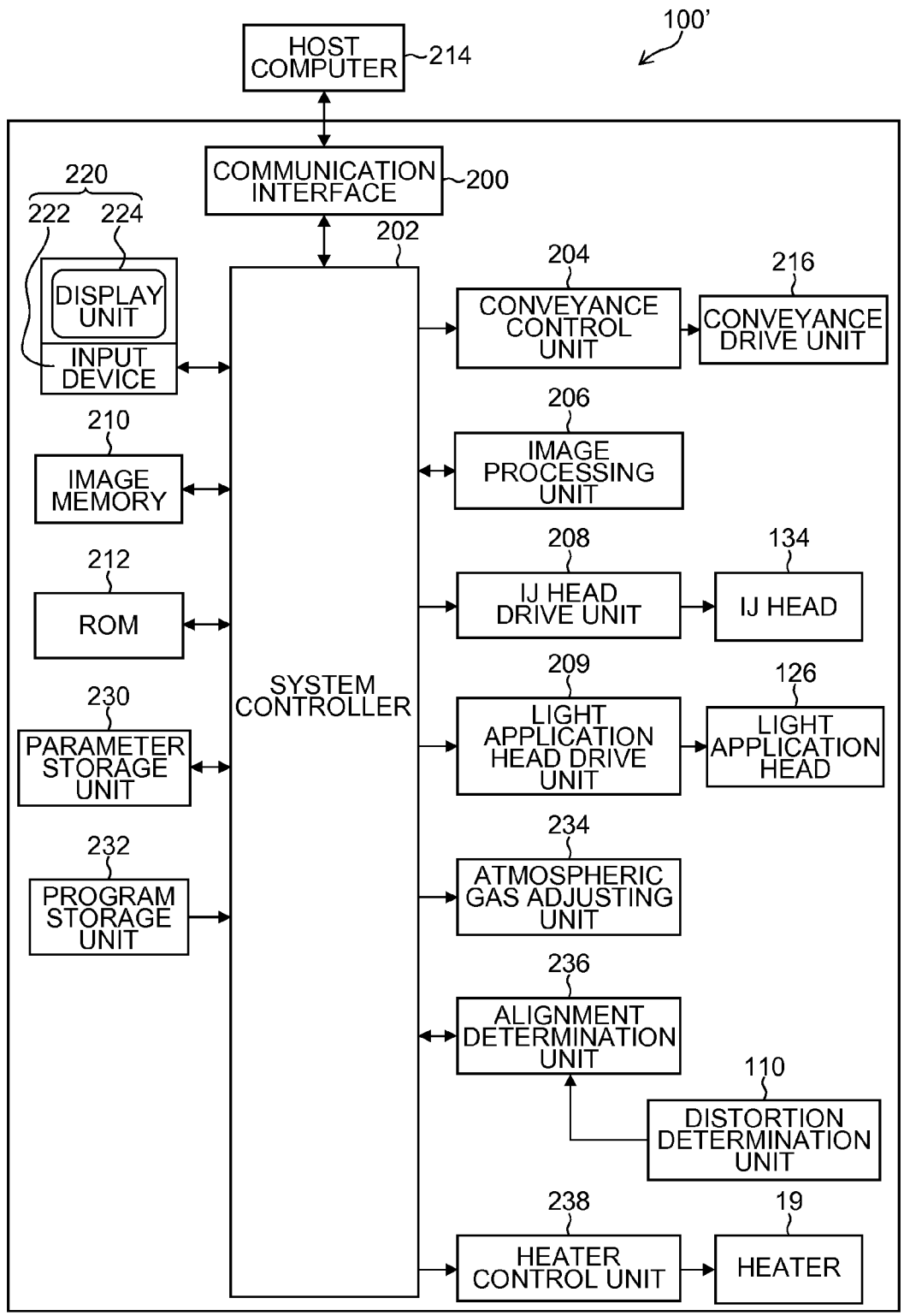
FIG. 25 is a block diagram showing a general composition of a control system of the pattern forming apparatus shown in FIG. 23.

FIG. 25 is a block diagram showing the approximate composition of a control system of a pattern forming apparatus 100' which achieves the pattern forming method shown in FIG. 23. The pattern forming apparatus 100' shown in FIG. 25 further includes a heater control unit 238, which controls the on/off switching and amount of radiated heat of the heater 19, and the like, in addition to the control system of the pattern forming apparatus 100 shown in FIG. 10.

The intermediate transfer method shown in FIG. 24 is provided with a heater control unit that controls the temperature of the heater 319 incorporated in the conveyance mechanism 324 of the substrate 302 and a heater incorporated in the transfer drum 301.

According to the pattern forming method and apparatus according to the third embodiment, it is possible to promote curing of the droplets (dots 26) which have landed on the substrate 10, as well as improving the beneficial effects of the modification treatment, by heating the substrate 10 (302). Furthermore, it is possible to control the shape of the dots 26, by suitably adjusting the temperature of the substrate 10.

<Fourth Embodiment>

Figure 26:
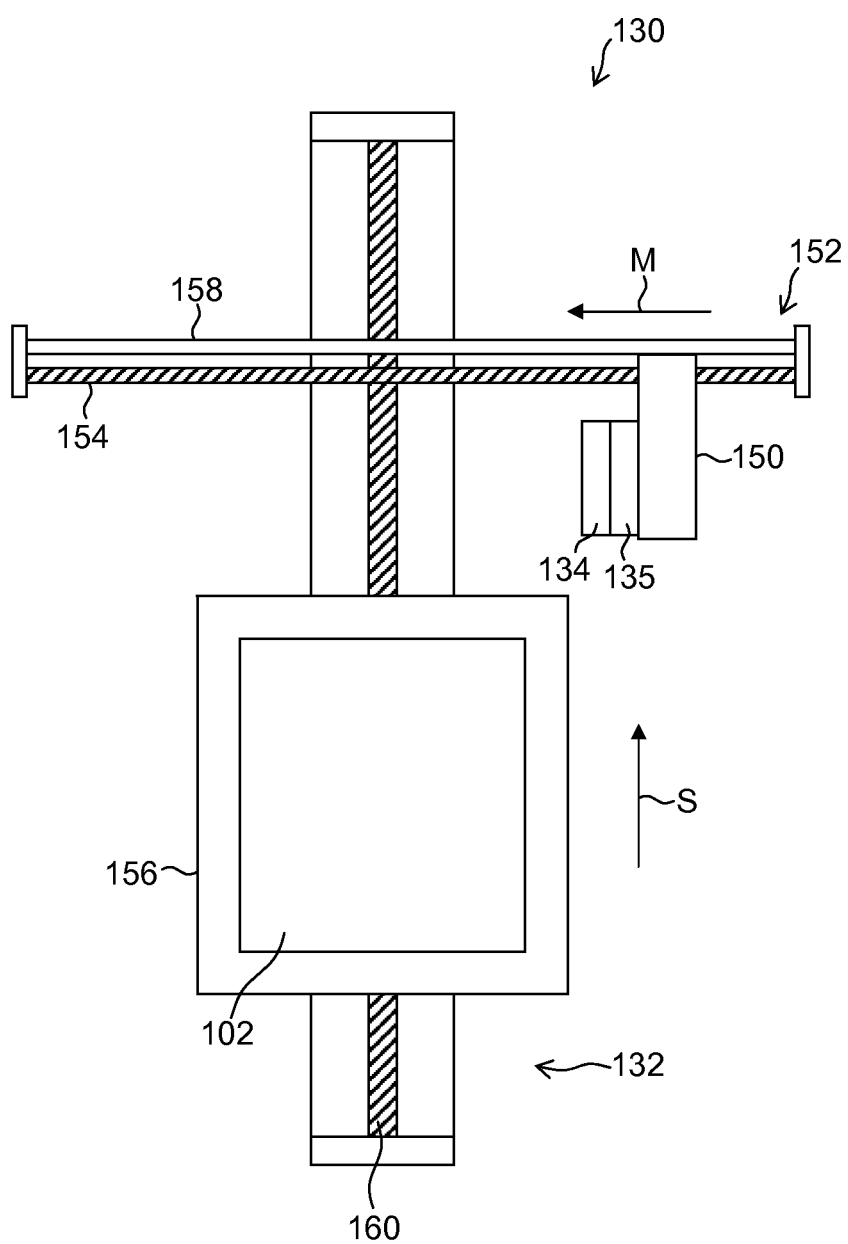
FIG. 26 is a schematic drawing showing the general composition of a pattern forming apparatus according to a fourth embodiment of the present invention.

Next, a fourth embodiment of the present invention is described. FIG. 26 is a schematic drawing showing an approximate composition of a pattern forming unit 130 in a pattern forming apparatus 100" according to a fourth embodiment. In the pattern forming unit 130 shown in FIG. 26, an inkjet head 134 and an auxiliary light application unit 135 are mounted on a carriage 150.

The present embodiment employs a liquid of which the viscosity is raised by irradiation with the auxiliary light. The auxiliary light application unit 135 applies the auxiliary light to the droplets (dots 26) which have landed on the substrate 102, thereby raising the viscosity of the dots 26.

The auxiliary light can employ light having a wavelength from the visible light region to the ultraviolet light region. When an ultraviolet-curable ink, which is cured by irradiation with ultraviolet light is used as the liquid which is ejected from the inkjet head 134, then ultraviolet light is employed as the auxiliary light. With ultraviolet-curable ink, the cured state (shape) of the dots 26 can be controlled by controlling the amount of ultraviolet light applied.

For example, it is possible to irradiate the dots 26 to a semi-cured state with a low amount of ultraviolet light, from several $mJ/cm^2$ to about several ten $mJ/cm^2$, and it is possible to irradiate the dots 26 to a fully cured state with a high amount of ultraviolet light from 100 $mJ/cm^2$ to about several hundred $mJ/cm^2$.

The "semi-cured state" is a state in which the dots are cured to an extent whereby the dots expand (are able to spread sufficiently) while preventing landing interference between the adjacent dots.

Figure 27A:
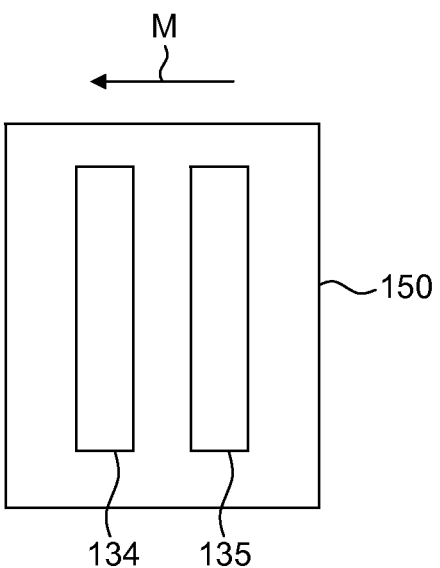
FIG. 27A is a plan view perspective diagram showing an example of an arrangement of the inkjet head shown in FIG. 26 and an ultraviolet light source.
Figure 27B:
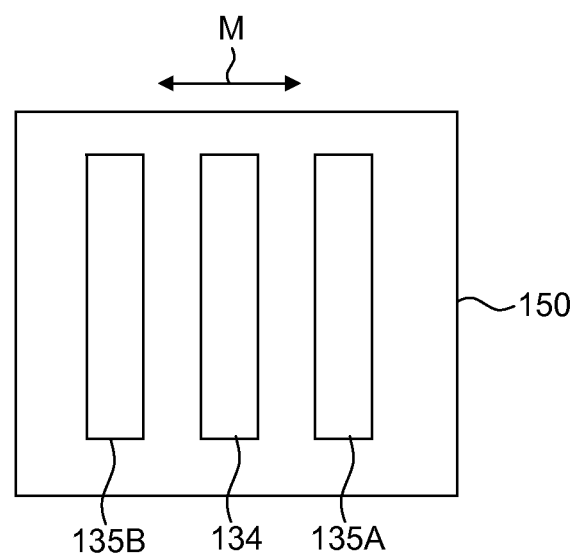
FIG. 27B is a plan view perspective diagram showing an example of an arrangement of the inkjet head shown in FIG. 26 and ultraviolet light sources.

FIGS. 27A and 27B are plan view perspective diagrams showing examples of the arrangement of the inkjet head 134 and the auxiliary light application unit 135. FIG. 27A shows the example of the arrangement in a case where liquid droplets are ejected from the inkjet head 134 when the carriage 150 moves in one direction (the direction denoted with reference symbol M).

As shown in FIG. 27A, the auxiliary light application unit 135 is arranged to the downstream side in the movement direction of the inkjet head 134, and applies the auxiliary light to the droplets (dots 26) immediately after the droplets have landed.

Also, when the inkjet head 134 is moved in the direction reverse to the direction denoted with the reference symbol M in FIG. 27A, it is possible to promote the curing of the dots 26 by irradiating with the auxiliary light by the auxiliary light application unit 135.

The mode shown in FIG. 27B includes the auxiliary light application units 135A and 135B, which are arranged on both sides of the inkjet head 134 in the movement direction of the inkjet head 134. When the inkjet head 134 is moved from the right-hand side to the left-hand side in FIG. 27B, at the least the auxiliary light application unit 135A emits the auxiliary light, and when the inkjet head 134 is moved from the left-hand side to the right-hand side in FIG. 27B, at the least the auxiliary light application unit 135B emits the auxiliary light.

According to the mode shown in FIG. 27B, even in a case where the inkjet head 134 ejects liquid droplets while moving reciprocally back and forth, as in the multi-pass method, it is possible to reliably irradiate the liquid (dots 26) which has been deposited on the substrate 102 (see FIG. 26) with the auxiliary light.

Figure 28:
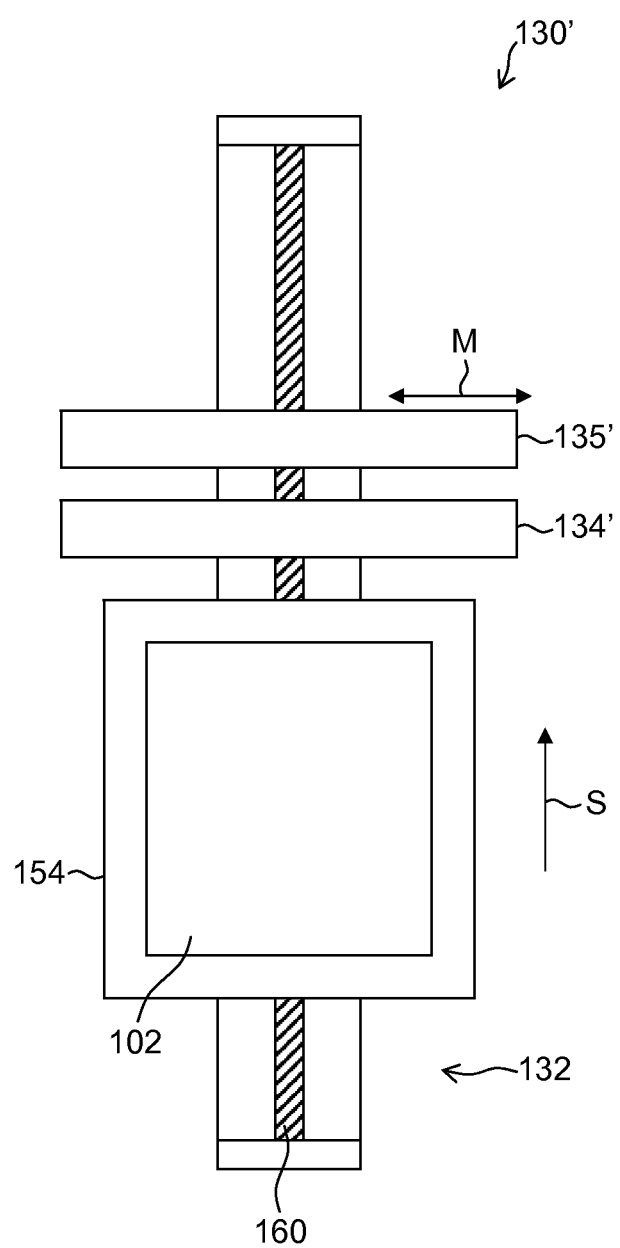
FIG. 28 is an illustrative diagram of a further example of the composition of the pattern forming apparatus shown in FIG. 26.

FIG. 28 is a schematic drawing showing a further example of a composition of the pattern forming unit in the pattern forming apparatus 100" according to the fourth embodiment. The pattern forming unit 130' shown in FIG. 28 includes a full line type of inkjet head 134', and an auxiliary light application unit 135' is arranged on the downstream side of the inkjet head 134' in the direction of conveyance of the substrate 102 (the direction denoted with reference symbol S).

In the auxiliary light application unit 135' shown in FIG. 28, a plurality of light sources (not shown) are arranged along the main scanning direction so as to compose an irradiation region spanning a length corresponding to the full width of the substrate 102 in the main scanning direction.

According to this mode, it is possible to simultaneously irradiate a plurality of droplets which have been deposited by the inkjet head 134' at the same timing, with the auxiliary light at substantially the same timing.

Figure 29:
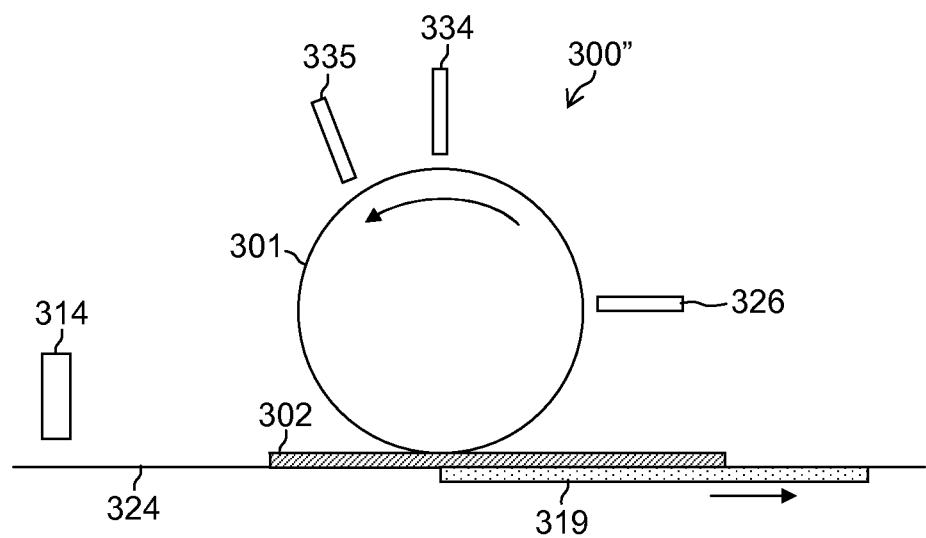
FIG. 29 is an illustrative diagram of yet a further example of the composition of the pattern forming apparatus shown in FIG. 26.

FIG. 29 is a schematic drawing showing yet a further example of a composition of the pattern forming apparatus according to the fourth embodiment. The pattern forming apparatus 300" shown in FIG. 29 employs the intermediate transfer method, and an auxiliary light application unit 335 is arranged to the downstream side of the inkjet head 334 in terms of the direction of rotation of the transfer drum 301.

In the composition shown in FIG. 29, by including another auxiliary light application unit on the downstream side of the transfer unit 305 in terms of the conveyance direction of the substrate 302, then it is possible to swiftly cure the fine pattern that has been transferred onto the substrate 302.

In order to prevent the auxiliary light from being applied from the auxiliary light application unit 135 (135A, 135B, 135', 335) (see FIGS. 27A, 27B and 28) to the nozzles of the inkjet head 134 (134', 334), a desirable mode is one which is provided with a shielding member to shield the auxiliary light, between the inkjet head 134 (134', 334) and the auxiliary light application unit 135 (135A, 135B, 135', 335).

Figure 30:
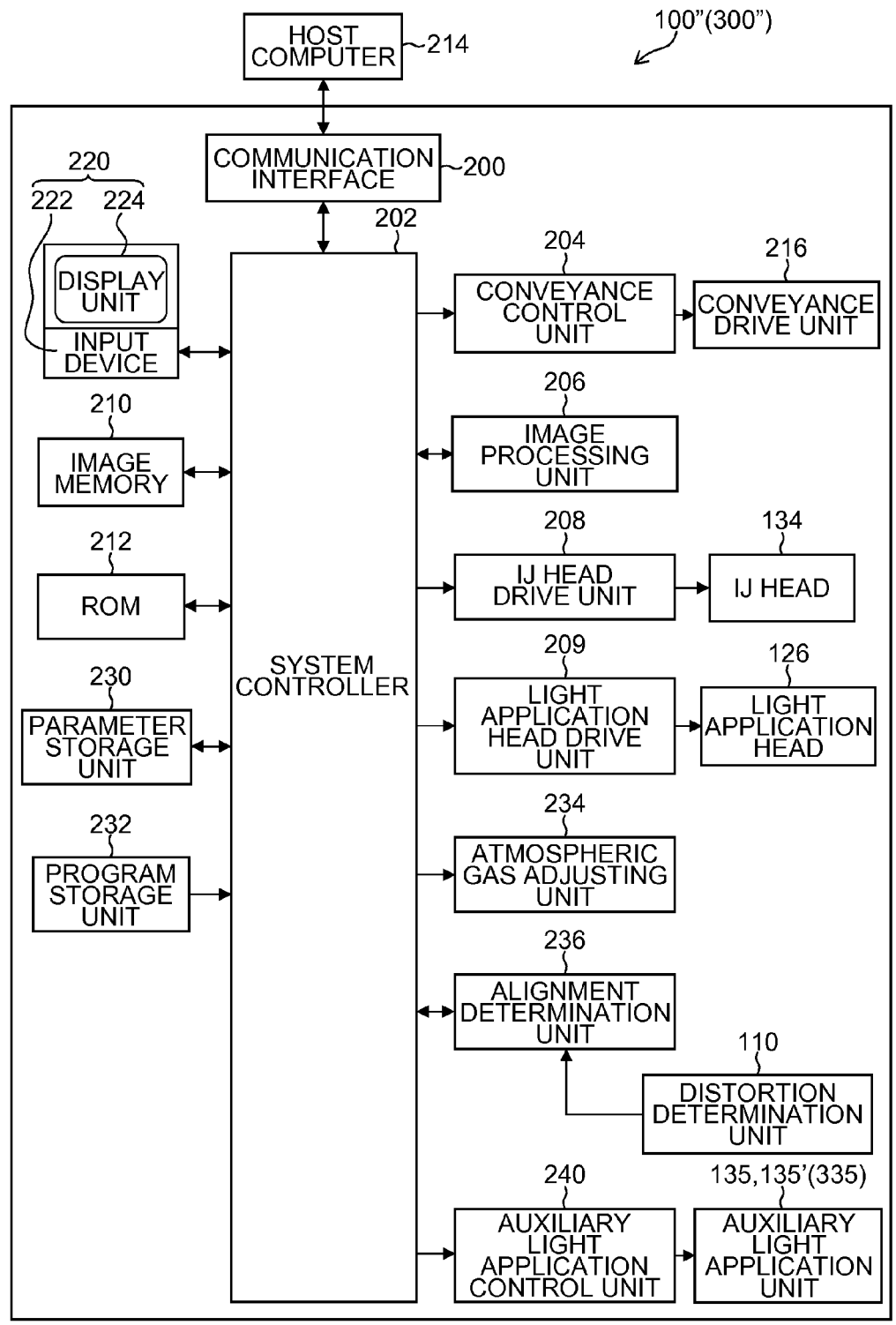
FIG. 30 is a block diagram showing a general composition of a control system of the pattern forming apparatus shown in FIG. 26.
Figure 31A:
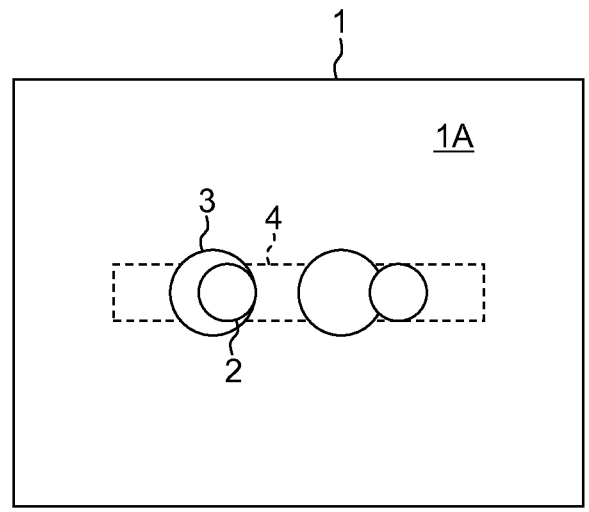
FIG. 31A is a diagram for describing problems of pattern image formation using an inkjet method in the related art.
Figure 31B:
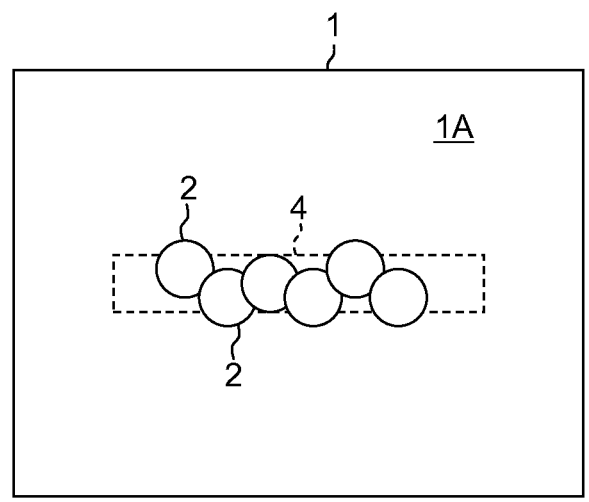
FIG. 31B is a diagram for describing problems of pattern image formation using an inkjet method in the related art.

FIG. 30 is a block diagram showing the approximate composition of a control system of the pattern forming apparatus 100" (300") according to the fourth embodiment. In comparison with the control system shown in FIG. 18, the control system shown in FIG. 30 further includes an auxiliary light application control unit 240, which controls the on/off switching and the light emitting amount of the auxiliary light application unit 135 (135', 335) in accordance with an instruction signal sent from the system controller 202.

According to the pattern forming apparatus and method according to the fourth embodiment, it is possible to promote curing of the droplets (dots 26) which have landed on the substrate 102 (or the outer circumferential surface of the transfer drum 301) by irradiating the dots 26 with the auxiliary light. Furthermore, by adjusting the application amount of the auxiliary light, it is possible to control the cured state of the dots 26.

The pattern forming method and pattern forming apparatus according to the present invention have been described in detail above; however, the present invention is not limited to the aforementioned embodiments, and it is of course possible for improvements or modifications of various kinds to be implemented, within a range which does not deviate from the scope of the present invention.

Explanation Of Reference Numerals 10, 102, 302: substrate; 10A: pattern forming surface; 12: pattern; 14: modification energy application unit; 16: reactive gas supply unit; 19: heater; 22, 134, 134', 334: inkjet head; 110: distortion determination unit; 112, 124, 132, 324: conveyance mechanism; 114, 314: sensor; 122: chamber; 126, 326: light application head; 135, 135', 335: auxiliary light application unit; 208: inkjet head drive unit; 209: light application head drive unit; 234: atmospheric gas adjustment unit; 236: alignment determination unit; 238: heater control unit; 301: transfer drum; 305: transfer unit

The invention claimed is:

1. A pattern forming method comprising:
a modification treatment step of, in accordance with a pattern to be formed on a pattern forming surface of a base body, applying a light beam having a width smaller than a diameter of each of dots to constitute the pattern, onto a treatment target region including at least outer edges on both sides in a width direction of a region where the pattern is to be formed in the pattern forming surface, thereby carrying out modification treatment on the treatment target region;
a droplet deposition step of ejecting and depositing droplets of a functional liquid by an inkjet method onto the region where the pattern is to be formed including the treatment target region where the modification treatment has been carried out;
the base body being an intermediate transfer body; and
a transfer step of transferring the pattern formed on the intermediate transfer body, onto a substrate.

2. The pattern forming method as defined in claim 1, wherein the base body is a substrate.

3. The pattern forming method as defined in claim 2, further comprising a temperature adjustment step of adjusting a temperature of the substrate at least one of: during the modification treatment step, during the droplet deposition step, and after the droplet deposition step.

4. The pattern forming method as defined in claim 2, further comprising, after the droplet deposition step, an auxiliary light application step of applying auxiliary light onto the deposited droplets.

5. The pattern forming method as defined in claim 1, further comprising a temperature adjustment step of adjusting a temperature of the substrate at least one of: during the transfer step, and after the transfer step.

6. The pattern forming method as defined in claim 1, further comprising, after the transfer step, an auxiliary light application step of applying auxiliary light onto the transferred pattern.

7. A pattern forming method comprising:
a modification treatment step of, in accordance with a pattern to be formed on a pattern forming surface of a base body, applying a light beam having a width smaller than a diameter of each of dots to constitute the pattern, onto a treatment target region including at least outer edges on both sides in a width direction of a region where the pattern is to be formed in the pattern forming surface, thereby carrying out modification treatment on the treatment target region;
a droplet deposition step of ejecting and depositing droplets of a functional liquid by an inkjet method onto the region where the pattern is to be formed including the treatment target region where the modification treatment has been carried out;
the base body being a substrate;
a determination step of determining distortion of the substrate; and
a correction data generation step of generating correction data for application data of the light beam and deposition data of the droplets, in accordance with the determined distortion of the substrate, wherein:
in the modification treatment step, the light beam is applied onto the treatment target region in accordance with the correction data, and
in the droplet deposition step, the droplets are ejected and deposited by the inkjet method onto the treatment target region where the modification treatment has been carried out, in accordance with the correction data.

8. The pattern forming method as defined in claim 1, wherein the modification treatment step includes a reactive gas supply step of supplying reactive gas to the region to which the light beam is applied.

9. The pattern forming method as defined in claim 1, wherein in the modification treatment step, an interior of the pattern is set as a modification treatment region to which the light beam is applied.

10. A pattern forming method comprising:
a modification treatment step of, in accordance with a pattern to be formed on a pattern forming surface of a base body, applying a light beam having a width samller than a diameter of each of dots to constitute the pattern, onto a treatment target region including at least outer edges on both sides in a width direction of a region where the pattern is to be formed in the pattern forming surface, thereby carrying out modification treatment on the treatment target region; and
a droplet deposition step of ejecting and depositing droplets of a functional liquid by an inkjet method onto the region where the pattern is to be formed including the treatment target region here the modification treatment has been carried out;
in the modification treatment step, the light beam haying an application width of not larger than ½ of a full width of the pattern being applied onto the outer edges on both sides of the pattern in the width direction.

11. A pattern forming method comprising:
a modification treatment step of, in accordance with a pattern to be formed on a pattern forming surface of a base body, applying a light beam having a width smaller than a diameter of each of dots to constitute the pattern, onto a treatment target region including at least outer edges on both sides in a width direction of a region where the pattern is to be formed in the pattern forming surface, thereby carrying out modification treatment on the treatment target region; and
a droplet deposition step of ejecting and depositing droplets of a functional liquid by an inkjet method onto the region where the pattern is to be formed including the treatment target region where the modification treatment has been carried out;
in the modification treatment step, the modification treatment being carried out on the treatment target region including outer sides of the outer edges of both sides of the pattern in the width direction.

12. The pattern forming method as defined in claim 1, wherein in the modification treatment step, the light beam having the width of not larger than ¹⁄₁₀ of the diameter of each of the dots is applied.

13. A pattern forming method comprising:
a modification treatment step of, in accordance with a pattern to be formed on a pattern forming surface of a base body, applying a light beam having a width smaller than a diameter of each of dots to constitute the pattern, onto a treatment target region including at least outer edges on both sides in a width direction of a region where the pattern is to be formed in the pattern forming surface, thereby carrying out modification treatment on the treatment target region;
a droplet deposition step of ejecting and depositing droplets of a functional liquid by an inkjet method onto the region where the pattern is to be formed including the treatment target region where the modification treatment has been carried out;
in the modification treatment step, the light beam being applied at a resolution exceeding a resolution of the deposition of the dots.

14. The pattern forming method as defined in claim 1, wherein in the modification treatment step, the light beam is applied at a resolution of not less than 10 times a resolution of the deposition of the dots.

* * * * *